United States Patent
Murayama et al.

(10) Patent No.: US 6,443,191 B1
(45) Date of Patent: Sep. 3, 2002

(54) VACUUM PROCESSING METHODS

(75) Inventors: Hitoshi Murayama, Shizuoka-ken; Tatsuyuki Aoike, Mishima; Toshiyasu Shirasuna, Mishima; Kazuyoshi Akiyama, Mishima; Takashi Ohtsuka, Susono; Daisuke Tazawa; Kazuto Hosoi, both of Mishima; Yukihiro Abe, Shizuoka-ken, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/842,154

(22) Filed: Apr. 26, 2001

(30) Foreign Application Priority Data

May 15, 2000 (JP) .......................................... 2000-142162

(51) Int. Cl.⁷ .............................................. B65B 31/00
(52) U.S. Cl. ................................. 141/65; 141/8; 141/98
(58) Field of Search ........................... 141/7, 8, 65, 66, 141/98; 118/715; 137/14

(56) References Cited

U.S. PATENT DOCUMENTS

| | | | |
|---|---|---|---|
| 5,433,238 A | * | 7/1995 | Cannizzaro et al. .......... 137/14 |
| 5,534,070 A | | 7/1996 | Okamura et al. ........ 118/723 E |
| 5,616,208 A | * | 4/1997 | Lee .............................. 156/345 |
| 5,718,769 A | * | 2/1998 | Hashizume et al. ........ 118/723 |
| 5,988,233 A | * | 11/1999 | Fosnight et al. .............. 141/63 |
| 6,082,414 A | * | 4/2000 | Wu et al. ........................ 141/8 |

FOREIGN PATENT DOCUMENTS

JP          8253865 A     10/1996

* cited by examiner

Primary Examiner—Gregory L. Huson
Assistant Examiner—Peter deVore
(74) Attorney, Agent, or Firm—Fitzpatrick, Cella, Harper & Scinto

(57) ABSTRACT

For making it feasible to suit to vacuum processing utilizing a system consisting of an exhaust section and a separable vacuum processing vessel section, to ensure flexibility of production, to prevent dust from attaching onto an article, so as to achieve increase in non-defective percentage of vacuum-processed articles, and also to suppress variability in vacuum processing characteristics among lots, an article is loaded into a movable vacuum processing vessel section, the vacuum processing vessel section is preliminarily pressure-reduced and moved, the vacuum processing vessel section is connected to an exhaust section, and communication is established between the vacuum processing vessel section and the exhaust section to perform vacuum processing. A first opening provided in the vacuum processing vessel section is connected to a second opening provided in the exhaust section and a vacuum seal valve of the first opening which is openable and closable, is opened. When opening the valve, the internal pressure of the vacuum processing vessel under reduced pressure is set higher than the pressure of another pressure-reduced space to be brought into communication therewith by the opening of the valve.

20 Claims, 7 Drawing Sheets

VACUUM PROCESSING METHODS

BACKGROUND OF THE INVENTION

1. Field of the Invention

The present invention relates to vacuum processing methods and, more particularly, to vacuum processing methods of carrying out some processing of an article in a reaction vessel (or container) kept in a pressure-reduced state. More specifically, the invention concerns methods of subjecting an article in a reaction vessel kept in a pressure-reduced state to such processing as deposited film formation, etching, and so on, which is used in steps of producing semiconductor devices, photosensitive members for electrophotography, line sensors for image inputting, image pickup devices, photovoltaic devices, and so on. Further, the invention relates to methods of producing the semiconductor devices, photosensitive members for electrophotography, line sensors for image inputting, image pickup devices, photovoltaic devices, etc. by making use of the aforementioned vacuum processing method in steps thereof.

2. Related Background Art

Conventionally, a number of methods are known as vacuum processing methods used in the steps of producing the semiconductor devices, photosensitive members for electrophotography, line sensors for image inputting, image pickup devices, photovoltaic devices, other various electronic devices, optical elements, and so on; e.g., vacuum evaporation, sputtering, ion plating, thermal CVD, photo CVD, plasma CVD, plasma etching, and so on. In addition, systems for carrying out the methods are also put into practical use.

For example, the plasma CVD methods, i.e., methods of decomposing a source gas by a dc or high frequency or microwave glow discharge to form a thin deposited film on a substrate, are practically used as favorable deposition forming means for production of various electron devices. For example, they are utilized in formation of a deposited film of hydrogenated amorphous silicon (hereinafter referred to as "a-Si:H") for electrophotography, or the like, and various systems for them have been also proposed heretofore.

It is possible to perform desired vacuum processing or to form a deposited film with desired characteristics by use of the systems proposed heretofore. For a vacuum processing method including the steps of preparing a vacuum processing system constructed of a reaction vessel and an exhauster separable from each other, connecting the reaction vessel to the exhauster for every lot, and thereafter carrying out vacuum processing, there are also proposals of apparatus having both high system operation efficiency and flexibility in production. Utilizing this advantage, improvement has been vigorously made recently, particularly, in vacuum processing methods suitable for multi-product production.

However, the market demand level has been becoming higher day after day, not only for the improvement in productivity, but also for the performance of products made by such vacuum processing methods. In order to meet this demand, therefore, there is a continuing need for development of a vacuum processing method that permits production of products with higher quality and that has a high productivity.

For example, in the case of the electro-photographic photosensitive members produced by plasma CVD, since digital, electrophotographic systems and color electrophotographic systems under spectacular spread in recent years are frequently operated to make copies of photographs, pictures, design graphics, etc. and output images, as well as letter documents, the demand level is very high for the quality of images formed thereby. It is thus of urgent necessity to provide electrophotographic apparatus adaptable for these requirements for high image quality. Technical studies have been done toward improvement in the quality of copied images from various aspects including investigation of the image forming process itself, and among others, the improvement in the characteristics of the photosensitive members for electrophotography is an inevitable subject. For accomplishing this subject, there are strong demands for achievement of a method of forming a photosensitive member for electrophotography capable of achieving improvement in vacuum processing characteristics and also capable of maintaining a high non-defective unit percentage (simply referred to as "non-defective percentage"), based on stable processing characteristics.

Under such circumstances, it is the present status that the conventional vacuum processing methods described above are still susceptible to improvement. In the vacuum processing method using the vacuum processing system in the structure wherein the reaction vessel and exhauster are separable from each other, as described above, the flexibility of production is improved. In this method, since the reaction vessel is moved with a substrate to be processed being placed inside prior to vacuum processing, there remains the subject of how dust is effectively prevented from attaching onto the substrate during the movement. One of countermeasures against it is a method of, prior to placement of the substrate in the reaction vessel, connecting the reaction vessel to the exhauster and then placing the substrate in the reaction vessel in that state. For adopting this substrate placement method, however, it becomes necessary to employ a new means for carrying the substrate into the reaction vessel while preventing the attachment of dust. Further, the vacuum processing cannot be started during the period between the placement of the substrate and completion of a pressure-reducing step of evacuating the interior of the reaction vessel and the time necessary for this evacuation is not so short, which thus leads to time loss in production tact.

In this vacuum processing method there readily occur variability in the vacuum processing characteristics among lots and thus there remains the subject of how the variability among lots are to be suppressed.

SUMMARY OF THE INVENTION

The present invention has been accomplished to solve the above subjects and an object of the invention is to provide a vacuum processing method that permits execution of stable vacuum processing and that permits deposited films to be formed without variability in quality.

Another object of the present invention is to provide a vacuum processing method of moving a vacuum processing vessel having an article placed therein, connecting the vacuum processing vessel to a pressure-reduced space different therefrom, and thereafter carrying out at least one vacuum processing step, which comprises novel means that enables attainment of improvement in non-defective percentage of vacuum-processed articles without degrading the flexibility of production while preventing the attachment of dust onto the articles and that also enables attainment of suppression of the variability of the vacuum processing characteristics among lots.

Still another object of the present invention is to provide a vacuum processing method capable of preventing the attachment of dust onto an article in a step of moving a vacuum processing vessel having the article placed therein and connecting the vacuum processing vessel to a pressure-reduced space different therefrom.

Another object of the present invention is to provide a vacuum processing method that excludes factors to cause the variability in the vacuum processing characteristics among lots and has a step configuration also excellent in the flexibility of production.

According to an aspect of the present invention, there is provided a vacuum processing method which comprises placing an article in a vacuum processing vessel and subjecting the article to at least one vacuum processing step therein with the vacuum processing vessel communicating with a pressure-reduced space different therefrom under reduced pressure, wherein the vacuum processing vessel has at least a first openable/closable opening, wherein the pressure-reduced space different from the vacuum processing vessel has at least a second opening, wherein the communication between the vacuum processing vessel and the pressure-reduced space different therefrom is established when, after closely connecting the first opening and the second opening to each other, the first openable/closable opening is brought into an open state, wherein for the connection, the vacuum processing vessel having the article placed therein is moved to locate the first opening and the second opening at closely connectable positions, and the first and second openings are connected to each other, and during the movement and connection, the first opening is kept in a closed state and the interior of the vacuum processing vessel is kept in a pressure-reduced state, wherein, for carrying out the at least one vacuum processing step, the communication between the different pressure-reduced space and the vacuum processing vessel with their respective openings being connected to each other is established by opening the first opening kept in the closed state during the connection, in a state in which the interior of the different pressure-reduced space is also kept in a pressure-reduced state, and wherein the internal pressure of the vacuum processing vessel kept in the pressure-reduced state during the movement and connection is set higher than the internal pressure of the different pressure-reduced space kept in the pressure-reduced state, when opening the first opening to establish the communication.

According to another aspect of the present invention, there is provided a vacuum processing method comprising the steps of effecting interconnection and disconnection between the interior of a pressure-reduced vacuum processing vessel and a pressure-reduced space, and subjecting an article housed in the vacuum processing vessel to a vacuum processing, wherein the interconnection is effected in a state such that at least the pressure inside the vacuum processing vessel is higher than the pressure of the pressure-reduced space.

The present invention is based on the results of intensive and extensive research to accomplish the above objects, i.e., based on such finding that it is feasible to accomplish the above objects by, during movement of the vacuum processing vessel having the article placed therein, maintaining the pressure inside the vacuum processing vessel within an appropriate range and connecting the vacuum processing vessel in this state with another pressure-reduced space different therefrom.

The invention will be described hereinafter with examples of a deposited film forming apparatus.

Apparatus and methods of forming a deposited film involve those schematically described below.

FIG. 1 shows an example of vacuum processing apparatus applied to the vacuum processing methods. Namely, FIG. 1 is a view schematically showing one configuration example of the deposited film forming apparatus by RF plasma CVD (hereinafter abbreviated as "RF-PCVD") using a frequency in the RF band as a power supply, specifically, an RF-PCVD system applied to formation of a light-receiving member for electrophotography. The structure of the forming apparatus illustrated in FIG. 1 is as follows.

The RF-PCVD system illustrated in this FIG. 1 is generally comprised of three sections; specifically, a deposition system 2100, a source gas supply system 2200, and an exhaust system (not shown) for evacuating the interior of a reaction vessel 2101. In the deposition system 2100 the reaction vessel 2101 houses a cylindrical substrate 2112, a substrate support 2113 incorporating a heater for heating the substrate, and source gas inlet pipes 2114. Further, a high frequency matching box 2115 is connected to a cathode electrode 2111 making a part of the reaction vessel 2101. The cathode electrode 2111 is electrically insulated from the earth potential by insulators 2120, while the cylindrical substrate 2112 is maintained at the earth potential through the substrate support 2113, thus also serving as an anode electrode. A high frequency voltage can be placed between the cathode electrode 2111 and the cylindrical substrate 2112.

The source gas supply system 2200 has source gas cylinders 2221 to 2226 storing respective gases of $SiH_4$, $GeH_4$, $H_2$, $CH_4$, $B_2H_6$, $PH_3$, etc., valves 2231 to 2236, 2241 to 2246, 2251 to 2256, and mass flow controllers 2211 to 2216. Each of the source gas cylinders is connected via a valve 2260 to the gas inlet pipes 2114 inside the reaction vessel 2101.

The formation of a deposited film using the RF-PCVD system illustrated in this FIG. 1 can be carried out, for example, according the following procedures.

First, the cylindrical substrate 2112 is placed in the reaction vessel 2101 and the interior of the reaction vessel 2101 is evacuated by the unrepresented exhaust system (e.g., a vacuum pump). Then, the temperature of the cylindrical substrate 2112 is controlled to a predetermined temperature of 200° C. to 350° C. by the substrate-heating heater built in the substrate support 2113.

For flowing the source gas for formation of the deposited film from the source gas supply system 2200 into the reaction vessel 2101, for example, the following procedures are carried out.

First, it is confirmed that the valves 2231 to 2237 of the gas cylinders and a leak valve 2117 of the reaction vessel are closed and also that the gas inlet valves 2241 to 2246, outlet valves 2251 to 2256, and auxiliary valve 2260 are opened. Then, a main valve 2118 is opened to evacuate the interior of the reaction vessel 2101 and the interior of gas pipe 2116.

When the reading of a vacuum gauge 2119 reaches about $7 \times 10^{-4}$ Pa, the auxiliary valve 2260 and outlet valves 2251 to 2256 are closed.

After that, the valves 2231 to 2236 are opened to introduce the respective gases from the gas cylinders 2221 to 2226 and a pressure of each gas is controlled to a predetermined pressure, e.g., to 2 $kg/cm^2$ by pressure regulators 2261 to 2266. Then, the inlet valves 2241 to 2246 are gradually opened to introduce the respective gases into the mass flow controllers 2211 to 2216.

After completion of the above preparation operation to complete preparation for deposition, each of layers is formed according to the following procedures.

When the cylindrical support 2112 reaches a predetermined temperature, one or some needed out of the outlet valves 2251 to 2256, and the auxiliary valve are gradually opened to introduce predetermined gas from the gas cylinders 2221 to 2226 through the gas inlet pipes 2114 into the reaction vessel 2101. Then, each source gas is regulated to a predetermined flow rate by the mass flow controller 2211 to 2216. On that occasion, the aperture of the main valve 2118 is adjusted so as to control the pressure in the reaction vessel 2101 to a predetermined value while monitoring the vacuum gauge 2119. After the internal pressure becomes stable, the RF power supply (not shown), for example, of the frequency of 13.56 MHz, is set to a desired power to introduce the RF power through the high frequency matching box 2115 and the cathode 2111 into the reaction vessel 2101 whereby glow discharge occurs with the cylindrical substrate 2112 acting as an anode. This discharge energy decomposes the source gas introduced into the reaction vessel and a deposited film comprising prescribed silicon as a matrix is formed on the cylindrical substrate 2112. The formation of the deposited film is carried on for a predetermined time. When the deposited film is formed in a desired thickness, the supply of RF power is stopped and the outlet valves are closed to stop the flow of gas into the reaction vessel, thus terminating the formation of the deposited film.

Similar operation is carried out a desired number of times, e.g., several times, thereby forming deposited films in desired multi-layer structure, e.g., a light-receiving layer.

It is needless to mention that in the production of the deposited films in the multi-layer structure described above, the outlet valves other than those of necessary gases are all closed during formation of each of the layers. In order to prevent the gas utilized in formation of a previous layer from remaining in the reaction vessel 2101 and in the pipe from the outlet valves 2251 to 2256 to the reaction vessel 2101, an operation of closing the outlet valves 2251 to 2256, opening the auxiliary valve 2260, and fully opening the main valve 2118 to evacuate the interior of the system once to a high vacuum, is carried out before formation of a next layer as occasion may demand.

In order to uniformize the film formed, it is also effective to rotate the cylindrical substrate 2112 at a predetermined speed by a driving unit (not shown) during formation of the layers.

Further, it is needless to mention that the gas species and valve operations described above are subject to change according to production conditions of the respective layers.

In addition to the deposited film forming apparatus and forming methods by the RF plasma CVD method using the frequency in the RF band, which have been commonly used heretofore, the VHF plasma CVD (hereinafter abbreviated as "VHF-PCVD") using the high frequency power in the VHF band is drawing attention in recent years. Further, development is also active in formation of various deposited films by this VHF plasma CVD method. The reason is that the VHF-PCVD method has the advantages of a high film deposition rate and capability of providing the deposited film with high quality and is thus expected as means capable of simultaneously attaining cost reduction and high quality of products. For example, U.S. Pat. No. 5,534,070 (Japanese Patent Application Laid-Open No. 6-287760) discloses the apparatus and method that are applicable to formation of a-Si based light-receiving members for electrophotography.

In addition, development is also under way to develop a deposited film forming apparatus capable of housing a plurality of substrates, as illustrated in FIGS. 2A and 2B, which permits simultaneous formation of a plurality of light-receiving members for electrophotography and which has an extremely high productivity.

FIGS. 2A and 2B are views showing one configuration example of the deposited film forming apparatus capable of housing a plurality of substrates, in which FIG. 2A is a schematic, sectional view and FIG. 2B a schematic, sectional view along a cut line 2B—2B of FIG. 2A.

An exhaust duct 311 is integrally formed on a side face of a reaction vessel 301 and the other end of the exhaust duct 311 is connected to an exhaust system (not shown). Six cylindrical substrates 305 to be subjected to the formation of a deposited film are placed in parallel to each other so as to surround the central part of the reaction vessel 301. Each cylindrical substrate 305 is held on a rotation shaft 308 and is arranged to be heated by a heater 307. When each motor 309 is actuated, the rotation shaft 308 is rotated via a reduction gear 310, so that the cylindrical substrate 305 rotates about the center axis along the direction of a generator thereof.

Source gases are supplied through a source gas supply means 312 into a deposition space 306 surrounded by the six cylindrical substrates 305. The VHF power is supplied from a VHF power supply 303 via a matching box 304 and a cathode electrode 302 to the deposition space 306. In this system, the cylindrical substrates 305 are also maintained at the earth potential through the rotation shafts 308 and thus act as anode electrodes.

The formation of deposited films using this system illustrated in FIGS. 2A and 2B, is carried out according to the procedures schematically described below.

First, the cylindrical substrates 305 are placed in the reaction vessel 301 and the interior of the reaction vessel 301 is evacuated through the exhaust duct 311 by the unrepresented exhaust system. Then, the cylindrical substrates 305 are heated and controlled to a predetermined temperature of about 200° C. to 300° C. by the heaters 307.

When the cylindrical substrates 305 reach the predetermined temperature, the source gas is introduced through the source gas supply means 312 into the reaction vessel 301. After it is confirmed that the flow rate of the source gas reaches a set value and the pressure in the reaction vessel 301 becomes stable, the predetermined VHF power is supplied from the high frequency power supply 303 via the matching box 304 to the cathode electrode 302. This places the VHF power between the cathode electrode 302 and the cylindrical substrates 305 also serving as anode electrodes, whereby glow discharge occurs in the deposition space 306 surrounded by the cylindrical substrates 305. This glow discharge excites and dissociates the source gas to form deposited films on the cylindrical substrates 305.

After formation of the films in a desired thickness, the supply of the VHF power is stopped and the supply of the source gas is also stopped, thereby ending the formation of deposited films. Like operation is carried out several times to form deposited films in desired multi-layer structure, e.g., light-receiving layers.

During the formation of deposited films the cylindrical substrates 305 are rotated at a predetermined speed through the rotation shafts 308 by the motors 309 whereby the deposited films are formed across the entire periphery of the surfaces of the cylindrical substrates. In addition, this uniformizes the deposited films obtained.

Japanese Patent Application Laid-Open No. 8-253865 discloses the technology of simultaneously forming deposited films on a plurality of substrates by use of plural electrodes. It describes that the simultaneous formation of the deposited films on the plural substrates by use of the plural electrodes permits attainment of effects of improving the productivity and of improving uniformity of characteristics of deposited films. The formation of deposited films in this form can be realized, for example, by use of a system having the structure as illustrated in FIGS. 3A and 3B.

FIGS. 3A and 3B show an example of apparatus employing a method of simultaneously forming deposited films on plural substrates by use of plural electrodes, in which FIG. 3A is a schematic, vertical, sectional view and FIG. 3B a schematic, horizontal, sectional view. An exhaust duct 405 is integrally formed on a top surface of a reaction vessel 400 and the other end of the exhaust duct 405 is connected to an exhaust system (not shown). Inside the reaction vessel 400, a plurality of cylindrical substrates 401 to be subjected to the formation of deposited films are placed in parallel to each other. Each cylindrical substrate 401 is held on a shaft 406 and is arranged to be heated by a heater 407. Each cylindrical substrate 401 is rotated through the shaft 406 by a driving means such as a motor or the like (not shown), as occasion may demand.

The VHF power is supplied from a VHF power supply 403 via a matching box 404 and cathode electrodes 402 into the reaction vessel 400. In this system, the cylindrical substrates 401 are also maintained at the earth potential through the shafts 406 and thus act as anode electrodes.

Source gases are supplied through unrepresented source gas supply means set in the reaction vessel 400, into the reaction vessel 400.

The formation of deposited films by use of this system in the structure illustrated in FIGS. 3A and 3B can also be carried out according to similar procedures to those by the deposited film forming system described above referring to FIGS. 2A and 2B.

Meanwhile, a wide variety of products are made today by making use of such vacuum processing systems and vacuum processing methods and different vacuum processing systems are often used depending upon the various products. This diversity results from application of vacuum processing systems of sizes, materials, etc. optimal to respective types of products. For example, in the case of production of photosensitive members for electrophotography, it is sometimes necessary to change the vacuum processing systems used, more specifically, the dimensions of the deposited film forming apparatus, particularly, the cathode sizes, according to the diameters of the electrophotographic, photosensitive members to be produced.

Under the circumstances of the increasing diversity of products to be produced, when the products are made using the vacuum processing system consisting of the aforementioned reaction vessel and exhauster substantially integrated with each other, a new production line also including another exhauster must be added in order to newly produce different products, or an existing production line must be modified to replace the existing reaction vessel with a new reaction vessel. Naturally, new equipment investment becomes necessary for the addition of the new production line. For replacing the existing reaction vessel with a new reaction vessel, the equipment investment is lower, but production efficiency also becomes lower, because the production line cannot be used during the modification.

Further, in order to produce the conventional products and new products in parallel, individual production lines have to be prepared. If there will be change in necessary numbers of respective products in future, conversion of the systems will be implemented by modification, but the modification will require a considerable time, thus failing to adjust the ratio of numbers of production lines instantly.

For the purpose of quickly implementing the conversion of apparatus, attention is recently focused on a type in which the vacuum processing apparatus is constructed of the reaction vessel and exhauster separable from each other and in which a reaction vessel optimal for necessary products is connected to the exhauster to perform vacuum processing, according to a production plan. This type of the disconnectable configuration of the reaction vessel and exhauster has high flexibility in production and makes it feasible to achieve increase of production efficiency and decrease of production cost. In this disconnectable system configuration, where the reaction vessel is arranged movable, the loading of the substrate into the reaction vessel in the preparation step can be carried out by moving the reaction vessel to a stage for substrate loading. Accordingly, the reaction vessel in the fixed structure required use of a large-scale substrate carrier in order to carry and load the substrate into each reaction vessel, whereas the reaction vessel in the movable structure obviates the need for use of the large-scale substrate carrier and permits simplification of the production system.

Therefore, the method of constructing the vacuum processing apparatus of the reaction vessel and exhauster separable from each other, connecting the reaction vessel suitable for necessary products to the exhauster, and then performing vacuum processing, has many merits and is thus drawing particular attention in recent years.

The schematic structure of the system comprised of the reaction vessel and exhauster in the separable configuration is, for example, one as illustrated in an example of FIG. 4. FIG. 4 shows an example of the structure in which the reaction vessel and exhauster are separable from each other and, particularly, in which the reaction vessel is movable. Numeral 501 designates a movable reaction vessel section, which consists of a reaction vessel 506, a vacuum seal valve 508, a connection flange 504, and a carriage 513 on which the reaction vessel 506 is mounted, thereby permitting movement thereof. Numeral 502 denotes an exhaust section, which consists of an exhaust means 507, a vacuum seal valve 509, and a connection flange 505. Numeral 503 represents a connection section for connection between the reaction vessel section 501 and the exhaust section 502.

The structure inside the reaction vessel 506 can be constructed, for example, in the structure as illustrated in FIGS. 5A and 5B. FIGS. 5A and 5B are schematic views showing an example of the reaction vessel section in the deposited film forming apparatus for forming the photosensitive members for electrophotography. FIG. 5A is a schematic, sectional view and FIG. 5B a schematic, sectional view along a cut line 5B—5B of FIG. 5A.

An exhaust duct 611 is formed on a side face of a reaction vessel 601 and the other end of the exhaust duct 611 is connected to the vacuum seal valve 508 in FIG. 4. An unrepresented conductive mesh is set in the opening of the exhaust duct in order to prevent leakage of a high frequency power guided into the reaction vessel, to the exhaust means side. Cylindrical substrates 605 to be subjected to the formation of deposited films are placed at equal intervals and in parallel to each other on a common circle. Each substrate 605 is held on a rotation shaft 608 and a motor 609 connected thereto is actuated to rotate the rotation shaft 608 through a reduction gear 610, whereby the cylindrical substrate 605 rotates about the center axis along the direction of a generator thereof. The cylindrical substrates 605 can be heated by respective heaters 607.

The high frequency power outputted from a high frequency power supply 603 is supplied through a matching box 604 and a high frequency power supply cable 615 and via cathode electrodes 602 into the reaction vessel 601 serving as a deposition space. A cathode electrode 606 is also placed inside the placement circle of the cylindrical substrates 605 and the high frequency power outputted from a high frequency power supply 614 is supplied through a matching box 613 and a high frequency power supply cable 615 and via the cathode electrode 606 into the reaction vessel 601.

Source gas supply means 612 are placed inside the reaction vessel 601 and desired source gas is supplied therethrough into the reaction vessel 601.

The vacuum processing using the vacuum processing system illustrated in the example of FIG. 4 can be carried out according to the procedures schematically described below, for example, when the reaction vessel of the movable type is the deposition forming reaction vessel for formation of photosensitive members for electrophotography shown in the example of FIGS. 5A and 5B.

First, the movable reaction vessel section 501 is disconnected from the exhaust section 502, the connection flange 504 is connected to another exhaust system for loading of substrates (not shown), and in the thus connected state cylindrical substrates 605 are loaded into the reaction vessel 601. Then, the interior of the reaction vessel 601 is evacuated through the exhaust duct 611 by the exhauster for loading of substrates. It is needless to mention that the exhaust seal valve 508 is opened during this evacuation period. After the interior of the reaction vessel 601 is evacuated to a desired pressure, the vacuum seal valve 508 is closed and then the connection flange 504 is disconnected from the substrate-loading exhauster. Then, the movable reaction vessel section 501 is moved to the placement site of the exhaust section 502 and the connection flange 504 is brought into contact with the exhaust-side connection flange 505 through a vacuum seal and connected therewith. After the connection, the connection section 503 is fixed by fixing means such as screws, clamps, etc. as occasion demands.

After it is confirmed that the movable reaction vessel section 501 is connected to the exhaust section 502, the exhaust-side vacuum seal valve 509 is first opened, the interior of the pipe on the exhaust means 507 side with respect to the reaction-vessel-side vacuum seal valve 508 is evacuated by the exhaust means 507, and the reaction-vessel-side vacuum seal valve 508 is then opened to evacuate the interior of the reaction vessel 506.

This preparation step, i.e., the stage of loading the substrates into the reaction vessel 506, the stage of moving the reaction vessel section 501, and the stage of connecting the reaction vessel section 501 to the exhaust section 502, may also be carried out, for example, according to procedures of loading the substrates, thereafter moving the reaction vessel section 501 without evacuating the interior of the reaction vessel 506, and then connecting the reaction vessel section 501 to the exhaust section 502, different from the procedures described above. With those different procedures, a necessary condition is that evacuation is completed in the reaction vessel 506 etc. to establish a processable state before a start of an actual vacuum processing step with the reaction vessel section 501 being connected to the exhaust section 502. Accordingly, specific procedures in this preparation step can be adequately determined in consideration of work efficiency, productivity, etc. in each of production steps.

After the interior of the reaction vessel 506 is evacuated by the exhaust means 507 in this way, the cylindrical substrates 605 are heated and controlled to a predetermined temperature by the heaters 607 as occasion demands. When the cylindrical substrates 605 reach the predetermined temperature, the source gas is introduced through the source gas supply means 612 into the reaction vessel 601. After it is confirmed that the flow rate of the source gas reaches a set flow rate and the pressure inside the reaction vessel 601 becomes stable, the predetermined high frequency power is supplied from the high frequency power supplies 603, 614 via the matching boxes 604, 613 to the cathode electrodes 602, 606. The high frequency power thus supplied Induces glow discharge in the reaction vessel 601 and the glow discharge excites and dissociates the source gas, whereby deposited films are formed on the cylindrical substrates 605.

After the e deposited films are formed in a de sired thickness, the supply of a high frequency power is stopped and the supply of source gas is also stopped, thus terminating the formation of deposited films. For forming the deposited films in the multi-layer structure, similar operation is repeated several times. In this case, the multiple layers may be formed according to procedures of completely terminating discharge once at the time of completion of formation of one layer as described above, between two layers, changing the setting to a gas flow rate and a pressure for a next layer, and thereafter again inducing discharge to form the next layer, or the multiple layers may be continuously formed according to procedures of, after completion of formation of one layer, gradually varying the gas flow rate, pressure, and high frequency power to set values for the next layer in a fixed period.

During the formation of deposited films, the cylindrical substrates 605 are preferably rotated through the rotation shafts 608 at a predetermined speed by the motors 609 as occasion may demand. By rotating the cylindrical substrates 605, the deposited films are formed under the same conditions across the entire periphery of the surfaces of the cylindrical substrates, thus achieving better uniformization of the deposited films obtained.

After completion of the deposited film forming step in this way, the source gas in the reaction vessel 506 is adequately purged or preferably replaced with inert gas, and thereafter the vacuum seal valves 508, 509 are closed. Then, the connection section 503 is disconnected to bring the reaction vessel section 501 into the movable state. In this state, the reaction vessel section 501 is moved to a substrate unloading site.

As occasion may demand, the substrates 605 are cooled to a desired temperature, and thereafter an inert gas or the like is introduced via an unrepresented leak valve into the reaction vessel 506, so as to bring the interior of the reaction vessel 506 into the atmospheric pressure. After the interior of the reaction vessel 506 reaches the atmospheric pressure, the substrates 605 with the deposited films thereon are taken out of the reaction vessel 506.

After that, the components in the reaction vessel 506 are subjected to replacement, cleaning, etc. to recover the reaction vessel 506 into a state in which the deposited films can be formed again. Then, the reaction vessel 506 is again subjected to the aforementioned substrate loading procedure.

In the vacuum processing operation of carrying out the three divisional steps of substrate loading, formation of deposited films, and substrate unloading at the respective, separate sites, it is preferable in terms of efficiency to prepare and use a plurality of reaction vessel sections 501.

Namely, in the series of steps described above, at the stage when, after completion of formation of deposited films with a reaction vessel section 501 connected to the exhaust section 502, the reaction vessel section 501 is disconnected from the exhaust section 502, another reaction vessel section 501 already having passed through the preliminary preparation step of substrate loading is connected to the exhaust section and the step of formation of deposited films can be started subsequent thereto. This decreases a wait time and permits efficient operation as a whole of the apparatus.

The above described the examples of the apparatus and methods of forming the electrophotographic, photosensitive members, and it is noted that similar techniques can also be applied to other vacuum processing steps, e.g., etching, ion implantation, etc., or to other vacuum processing methods, e.g., sputtering, thermal CVD, etc., in addition to the above.

The above-stated conventional methods can be used to perform the vacuum processing with desired characteristics, for example, to form the deposited film well. Among others, the method employing the vacuum processing system in the separable configuration of the reaction vessel and exhauster and carrying out the vacuum processing after connection of the reaction vessel to the exhauster for every lot, has the flexibility in production, in addition to the high system operation efficiency. Utilizing this advantage, improvement has been energetically made particularly in recent years, as a vacuum processing method suitable for multi-product production.

However, as described previously, there are demands for further improvement in the performance of products made by this vacuum processing method, as well as improvement in productivity, in recent years, so that the market demand level is becoming higher day after day. Accordingly, there are desires for development of a vacuum processing method that permits the production of products with high quality and that has a high productivity, in order to meet the above demand.

For example, in the case of the electrophotographic, photosensitive members produced by the plasma CVD method, not only the letter documents, but also graphics including photographs, pictures, design images, etc. are frequently copied in the recently quickly spreading, digital, electrophotographic systems and color electrophotographic systems and thus the demand level for the quality of copied images is becoming very high, e.g., much higher resolution, high quality of output of halftone images like photographs, suppression of variability among photosensitive members or variability in characteristics in one photosensitive member, which can be the cause of irregular color or chromatic deviation with formation of color images, and so on. It is thus of urgent necessity to provide the electrophotographic apparatus adaptable for these demands for high image quality. Technological studies toward improvement in quality of copied images has been conducted from various aspects including the research of image forming process itself, and among others, the improvement in the characteristics of the photosensitive members for electrophotography is an essential subject. For accomplishing this subject, there are strong needs for attainment of the method of forming the photosensitive member for electrophotography, which can accomplish the improvement in the characteristics of vacuum processing and which is also stable in the processing characteristics to be able to maintain a high non-defective percentage. Then, there are earnest hopes for the vacuum processing method capable of producing the electrophotographic, photosensitive members with such high quality on a stable basis.

The present invention has been accomplished in view of this point and with focus on such knowing that, on the occasion of carrying out the vacuum processing by use of the processing system in which the vacuum processing vessel can be moved with the article being placed in the vacuum processing vessel, the pressure in the vacuum processing vessel is controlled in the appropriate range and in this state the vacuum processing vessel is connected to another pressure-reduced space different therefrom, whereby the vacuum processing, e.g., formation of a deposited film of a semiconductor or the like, can be performed at extremely high efficiency and with extremely high quality.

Namely, a vacuum processing method of the present invention is a vacuum processing method in which, in a state where an article is placed in a vacuum processing vessel and where under reduced pressure the vacuum processing vessel communicates with another pressure-reduced space different therefrom, the article is subjected to at least one step of vacuum processing steps, wherein the vacuum processing vessel comprises at least a first openable/closable opening; the pressure-reduced space different from the vacuum processing vessel comprises at least a second opening; the communication between the vacuum processing vessel and the pressure-reduced space different therefrom is established on the occasion of, after close connection between the first opening and the second opening, bringing the first openable/closable opening into an opened state; during execution of the connection, the vacuum processing vessel with the article being placed therein is moved to a position where the first opening and second opening can be closely connected to each other, and the openings are then connected; during execution of the movement and connection, the first opening is kept in a closed state and the interior of the vacuum processing vessel is kept in a pressure-reduced state; during execution of at least one step of the vacuum processing steps, the communication between the pressure-reduced space and the vacuum processing vessel with their openings being connected to each other is established by opening the first opening kept closed during the connection, while the interior of the pressure-reduced space is also kept in a pressure-reduced state; an internal pressure of the vacuum processing vessel kept in the pressure-reduced state during the movement and connection is set higher than an internal pressure of the pressure-reduced space kept in the pressure-reduced state, on the occasion of opening the first opening to establish the communication.

In the vacuum processing method of the present invention, it is desirable to set the internal pressure of the vacuum processing vessel kept in the pressure-reduced state during the movement and connection, preferably to not more than $1 \times 10^3$ Pa and more preferably to not more than $1 \times 10^2$ Pa.

On the other hand, when P1 [Pa] and P2 [Pa] represent the internal pressure of the vacuum processing vessel in the pressure-reduced state and the internal pressure of the pressure-reduced space in the pressure-reduced state, which are made to communicate with each other by opening the first opening after the connection, a difference between P2 and P1 preferably satisfies the following relation on the occasion of the communication:

$$P1-P2 \geq 0.1 \text{ Pa}.$$

Further, the difference between P2 and P1 preferably satisfies the following relation on the occasion of the communication:

$$P1-P2 \geq 1 \text{ Pa}.$$

In addition, the vacuum processing method of the present invention preferably comprises an operation of varying exhaust resistance between the pressure-reduced space and the vacuum processing vessel communicating with each other, after the first opening is opened to establish the communication. On that occasion, the exhaust resistance between the pressure-reduced space and the vacuum processing vessel communicating with each other is preferably decreased continuously or stepwise after the first opening is opened to establish the communication.

In the vacuum processing method of the present invention, the at least one of the vacuum processing steps, which is performed on the article with the pressure-reduced space and the vacuum processing vessel communicating with each other, may comprise a deposited film forming step. In this case, the deposited film forming step as the at least one of the vacuum processing steps may comprise a step of forming a deposited film having a plurality of regions different at least in composition. For example, the vacuum processing steps comprising the deposited film forming step as at least one step thereof are preferably formation of a deposited film for producing an electrophotographic photosensitive member.

BRIEF DESCRIPTION OF THE DRAWINGS

FIGS. 2A and 2B are views schematically showing an example of a system for producing light-receiving members for electrophotography by the VHF plasma CVD method using the frequency in the VHF band (a vacuum processing system for formation of deposited films), in which FIG. 2A is a vertical, sectional view and FIG. 2B a horizontal, sectional view;

FIGS. 3A and 3B are views schematically showing another example of a configuration of a system for producing light-receiving members for electrophotography by the VHF plasma CVD method using the frequency in the VHF band, in which FIG. 3A is a vertical, sectional view and FIG. 3B a horizontal, sectional view;

FIGS. 5A and 5B are views schematically showing the principal structure of an example of a vacuum processing vessel of the movable type, excluding the connection section to the exhaust section, in which FIG. 5A is a vertical, sectional view and FIG. 5B a horizontal, sectional view;

DETAILED DESCRIPTION OF THE PREFERRED EMBODIMENTS

Figure 1:
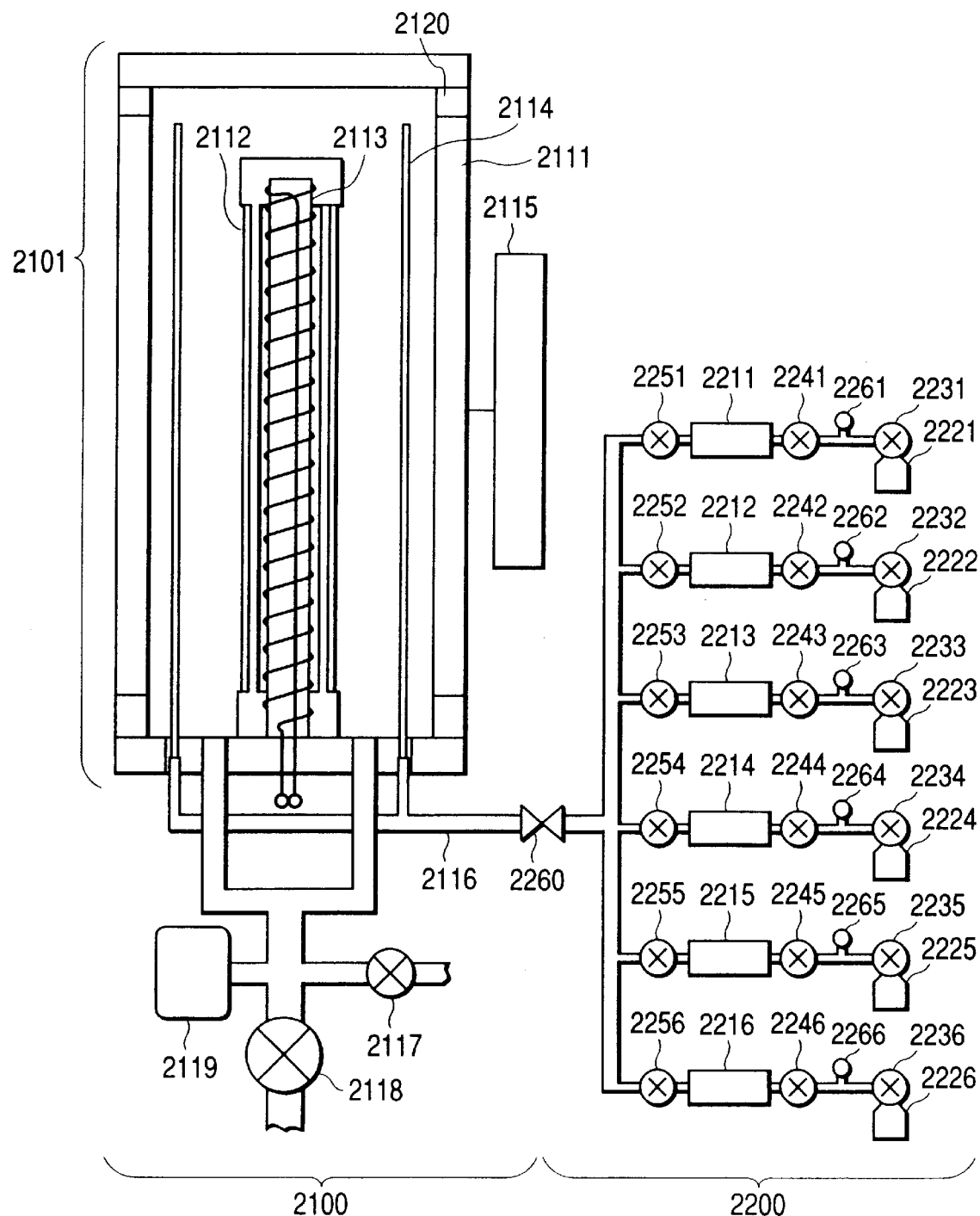
FIG. 1 is a schematic view showing an example of a system for producing a light-receiving member for electrophotography by the RF plasma CVD method using the frequency in the RF band (a vacuum processing system for formation of deposited film)
Figure 2A:
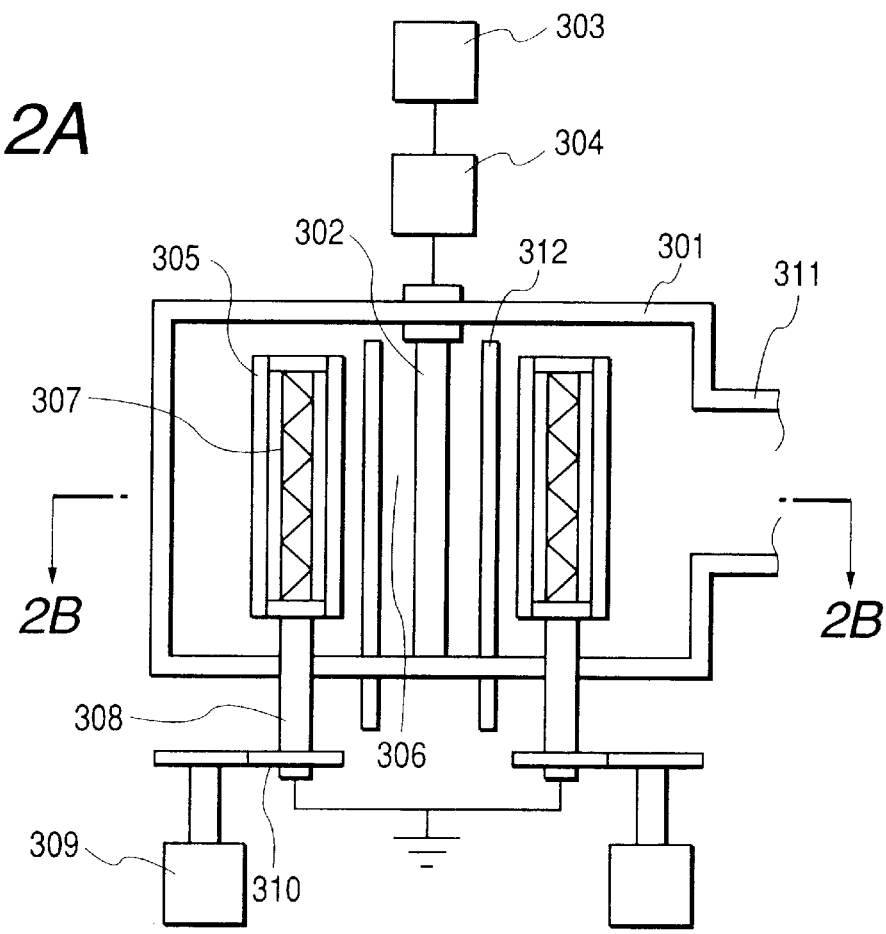
Figure 2B:
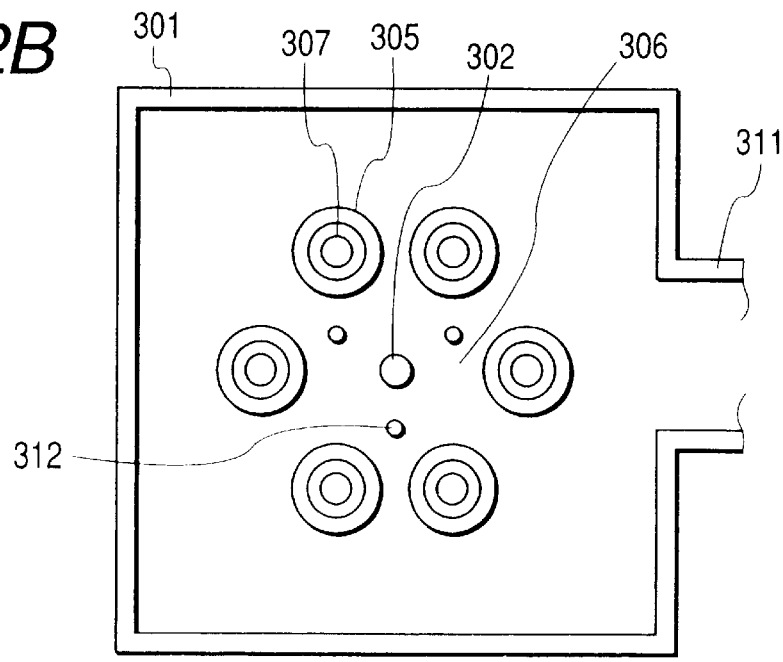
Figure 3A:
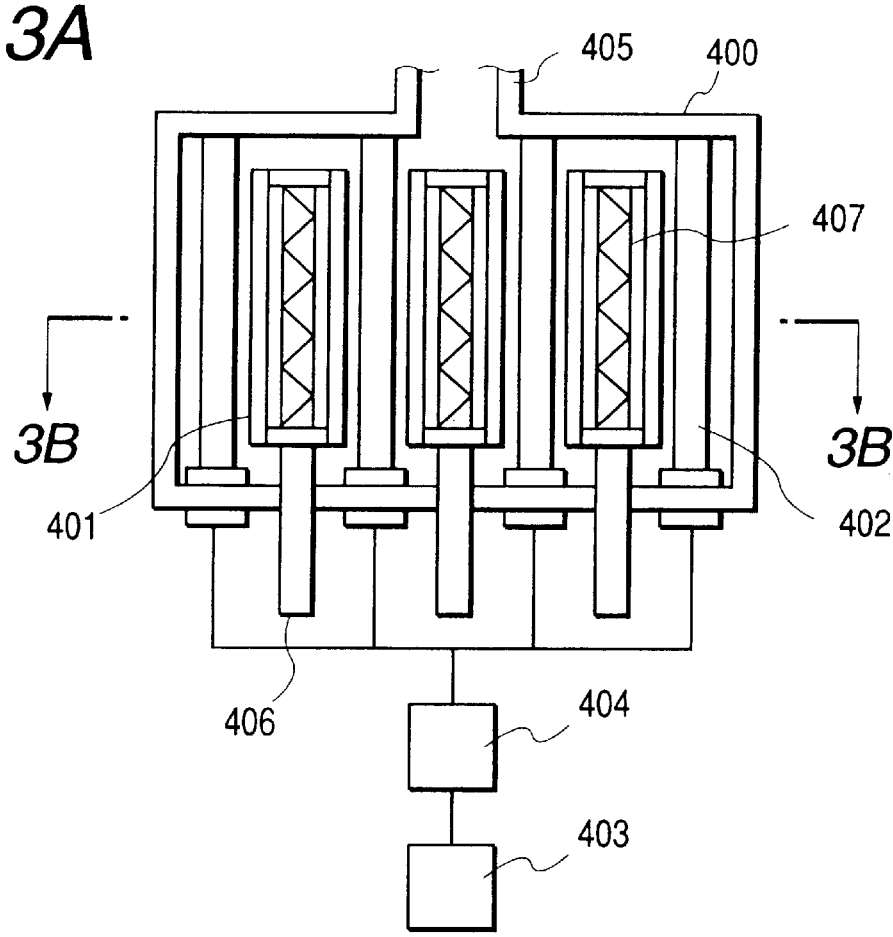
Figure 3B:
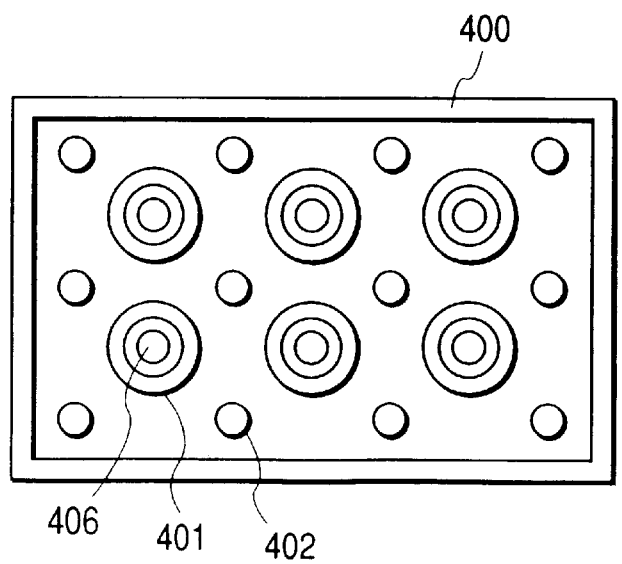

In the vacuum processing method of the present invention, an article is loaded in the vacuum processing vessel and the vacuum processing vessel is evacuated and moved in the pressure-reduced state. Then, the second opening provided in another pressure-reduced space different from the vacuum processing vessel is connected to the first opening provided in the vacuum processing vessel thus moved. This first opening is of openable/closable structure and is kept closed during the movement. After completion of the connection, the first opening is opened whereby the vacuum processing vessel and the pressure-reduced space different therefrom are made to communicate with each other under reduced pressure. At this time, the pressure in the vacuum processing vessel is set higher than the pressure in the pressure-reduced space communicating therewith.

By carrying out the steps of the loading of the article, the movement of the vacuum processing vessel, and the connection thereafter as described above, it becomes feasible to effectively prevent dust from attaching onto the article before vacuum processing. The loading of article into the vacuum processing vessel is carried out at a site different from the site where the vacuum processing itself is carried out, and thereafter the vacuum processing vessel is moved; this construction allows the system to maintain the flexibility of production. In addition, the interior of the vacuum processing vessel is preliminarily pressure-reduced, which largely decreases the time necessary for bringing the vacuum processing vessel into a desired pressure-reduced state after the connection. Accordingly, these successfully accomplish the effective operation of the vacuum processing system itself or the decrease of loss in production tact.

In addition, dust is prevented from attaching onto the article, so that increase in non-defective percentage of vacuum-processed articles is also accomplished. Cleanliness of the article in the step before vacuum processing is maintained with good repeatability and the exclusion of the factors to cause degradation of the vacuum processing characteristics is also achieved with high certainty during vacuum processing; therefore, it becomes feasible to achieve suppression of variability in the vacuum processing characteristics among lots.

The action and construction of the present invention will be detailed below.

In the vacuum processing method of the present invention, the interior of the vacuum processing vessel is preliminarily evacuated prior to the movement of the vacuum processing vessel so that the pressure therein becomes a reduced pressure. By maintaining the interior of the vacuum processing vessel under reduced pressure, dust is prevented from floating in the vacuum processing vessel even if vibration is encountered during the movement. Since there is thus no floating dust itself in the vacuum processing vessel, the dust is prevented surer from attaching onto the article, for example, onto a substrate. This results in greatly reducing defects of the vacuum processing characteristics due to the dust attaching onto the article, which achieves increase in non-defective percentage.

In addition, in the vacuum processing method of the present invention, as well as the above-stated point that the interior of the vacuum processing vessel is pressure-reduced during the movement of the vacuum processing vessel, the pressure inside the vacuum processing vessel is set higher than the pressure in the pressure-reduced space to be connected with the vacuum processing vessel after the movement. This provision of the difference between the internal pressures improves the vacuum processing characteristics and also decreases the variability in the vacuum processing characteristics among lots. Although the inventors haven't completely elucidated the mechanism for achieving this effect yet, we speculate that it is achieved according to the mechanism schematically described below, based on the research conducted toward completion of the present invention.

For example, in the vacuum processing method using the vacuum processing system wherein the reaction vessel and exhauster are of the separable structure, the article after completion of vacuum processing is taken out of the reaction vessel disconnected from the exhauster, after the vacuum processing. After that, where the interior of the reaction vessel is contaminated with execution of vacuum processing, the interior of the vessel and others are cleaned by cleaning means such as dry etching, wet etching, etc. according to the degree of contamination at a point of time after vacuum processing for every lot or after a predetermined number of vacuum processes. Therefore, it is feasible to maintain the interior of the reaction vessel in desired cleanliness.

On the other hand, concerning the exhauster connected to the reaction vessel, maintenance thereof is carried out at need. As a part of the maintenance, cleaning or the like of the interior is carried out at regular intervals. However, the frequency of the cleaning of the interior in the exhauster is much smaller than the frequency of the cleaning of the interior of the reaction vessel. Accordingly, with increase in the number of processes, by-products and the like produced during the vacuum processing will be accumulated therein and cleanliness levels inside the exhauster will become heavily different between immediately after maintenance and immediately before next maintenance.

When the reaction vessel with a clean article being placed therein is connected to the exhauster with accumulated contamination therein to communicate therewith, if the internal pressure of the exhauster were higher than the internal pressure of the reaction vessel the gas would flow from the exhauster to the reaction vessel immediately after the connection. With this gas flow, the contaminants accumulated inside the exhauster would also flow more or less from the exhauster to the reaction vessel. If the contaminants flowing back from the exhauster should attach the clean article they could be the cause of inducing deficiencies of the vacuum processing characteristics.

As another possibility, the by-products and the like entering the interior of the reaction vessel are decomposed and activated by the energy guided into the reaction vessel during vacuum processing, e.g., by heat, by high frequency power, or by energy of plasma used during vacuum processing, to be absorbed as impurities into the surface of the vacuum-processed article. As a consequence, they could be the cause of inducing degradation of the vacuum processing characteristics.

In addition, since the amount of the aforementioned contaminants flowing back from the exhauster is dependent upon the degree of contamination accumulated inside the exhauster, the amount will tend to increase with increase in the number of processes. Therefore, the amount of mixed impurities is not constant from lot to lot and thus there are variability in the amount of impurities among processing lots. This would result in characteristic variability among vacuum processing lots. Particularly, in the case wherein the exhauster is shared and a plurality of reaction vessels are alternately used, the total number of processes will be large and the variability will become larger. In addition, in the case wherein the common exhauster is used for a variety of vacuum processes, the difference among the vacuum processes will often cause much larger variability.

In addition to the above-stated direct influence, indirect influence can also be encountered. For example, the by-products and the like entering the interior of the reaction vessel can also be decomposed and activated by the energy guided into the reaction vessel during vacuum processing, e.g., by heat, by high frequency power, or by energy of plasma used during vacuum processing, to be accumulated on the internal wall of the reaction vessel and on the components in the reaction vessel, e.g., on the surfaces of the electrodes, gas inlet tubes, etc. or to modify these surfaces. Most of these contaminants remaining in the reaction vessel can be cleaned by cleaning after vacuum processing, but it is not always easy in certain cases to restore the reaction vessel into the initial state, depending upon the types of by-products, and/or the materials of the internal wall of the reaction vessel and the components in the reaction vessel. When the complete removal is hard as in these cases, the surface conditions and compositions of the internal wall of the reaction vessel and the components in the reaction vessel can vary with a lapse of time and it can also result in change in the vacuum processing characteristics with a lapse of time.

In contrast with it, since the vacuum processing method of the present invention utilizes the vacuum processing vessel having the first openable/closable opening, it is feasible to maintain the interior of this vacuum processing vessel in desired cleanliness by the cleaning means of dry etching, wet etching, or the like optimal for the details of vacuum processing at a point of time after vacuum processing for every processing lot or after a predetermined number of vacuum processes.

The vacuum processing method of the present invention also makes use of the pressure-reduced space different from the vacuum processing vessel, e.g., the exhauster or the like, which is made to communicate with the vacuum processing vessel. Inside this different pressure-reduced space, e.g., inside the exhauster, the contaminants such as the by-products and the like produced and the vacuum processing will have been accumulated, because a plurality of vacuum processing vessels will be connected in succession to perform vacuum processing. Accordingly, the cleanliness inside the different pressure-reduced space, for example, inside the exhauster is inferior to that inside the vacuum processing vessels subjected to maintenance thereof.

If during the movement of the vacuum processing vessel the pressure in the vacuum processing vessel is lower than the pressure inside the different pressure-reduced space, e.g., inside the exhauster to be connected after the movement, the by-products and the like of vacuum processing accumulated inside the different pressure-reduced space, e.g., inside the exhauster communicating with the vacuum processing vessel will readily enter the interior of the vacuum processing vessel through the first opening. Since in the method of the present invention the pressure in the vacuum processing vessel is set higher than the pressure inside the different pressure-reduced space, e.g., inside the exhauster to be made to communicate therewith, the gas flow caused by the difference between the internal pressures is directed from the vacuum processing vessel toward the different pressure-reduced space, e.g., toward the exhauster upon establishment of the communication. This flow caused by the difference between the internal pressures effectively acts to prevent the phenomenon that the by-products and the like of vacuum processing accumulated inside the separate pressure-reduced space, e.g., inside the exhauster enter the interior of the vacuum processing vessel.

Although the interior of the vacuum processing vessel itself is normally maintained in desired cleanliness, a small amount of remaining dust can be scattered because of fine mechanical vibration or the like occurring inevitably during the movement. As another possibility, particles, films, etc. of the by-products of vacuum processing, which adhere relatively stably to the internal wall surface and the like without great mechanical vibration, can also be peeled off and scattered by mechanical vibration caused accidentally during the movement. Since in the method of the present invention the movement and connection are carried out while keeping the interior of the vacuum processing vessel itself under reduced pressure, the accident of fine dust floating in the vessel can be avoided even with occurrence of peeling. Therefore, the method of the invention can prevent the particles and films of the by-products of vacuum processing, remaining in small amount on the internal wall of the vacuum processing vessel itself and the like, from floating and attaching onto the clean article placed therein.

In the present invention, the interior of the vacuum processing vessel is maintained under reduced pressure during the movement thereof to prevent the dust from attaching onto the article (e.g., a substrate to be subjected to vacuum processing) and this action can be made surer by setting the pressure during the movement of the vacuum processing vessel preferably to not more than $1\times10^3$ Pa and more preferably to not more than $1\times10^2$ Pa. When the internal pressure is set in this range, the pressure inside the vacuum processing vessel also needs to be set higher than the pressure in the different pressure-reduced space to be connected after the movement.

On the other hand, there are no specific restrictions on the lower limit of the pressure in the vacuum processing vessel as long as the pressure in the vacuum processing vessel is set in the range higher than the vacuum (pressure) achieved in the different pressure-reduced space to be connected after the movement. From the aspect of providing the pressure difference described below, it is desirable to set the pressure inside the vacuum processing vessel preferably to not less than 0.1 Pa and more preferably to not less than 1 Pa. If during reduction of pressure inside the vacuum processing vessel a vacuum degree higher than necessary is selected as the pressure (vacuum) therein, an evacuation time necessary for arrival at the selected high vacuum will become longer and thus it can be a new factor of degrading workability.

In addition, during the movement of the vacuum processing vessel the interior of the vacuum processing vessel is preferably filled with a desired gas under a predetermined reduced pressure. For example, the interior of the vacuum processing vessel is evacuated once to a pressure sufficiently lower than the predetermined pressure (vacuum), and thereafter the desired gas is introduced to be filled under the predetermined pressure (vacuum). Alternatively, the atmosphere in the vacuum processing vessel is preliminarily replaced with the desired gas and thereafter the pressure is reduced to the predetermined pressure (vacuum) so as to fill the vessel with the gas. The filling gas contains little water, different from the atmosphere, so as to promote evaporation of water adsorbing to the wall surface of the vacuum processing vessel and the like thus more effectively achieve the evaporative removal of water adsorbing to the wall surface and the like during the movement of the vacuum processing vessel. After that, the vacuum processing vessel is connected to the exhaust section and the desired gas filled therein is evacuated to expel the evaporatively removed water to the outside of the vacuum processing vessel system, whereby the water remaining inside is reduced prior to execution of vacuum processing, so as to greatly relieve the influence of the remaining water on the vacuum processing. The desired gas to be filled for the above purpose is a gas having a low water content, the selected gas itself not producing a film attaching on the internal wall surface of the vacuum processing vessel and the like and not causing corrosion of the internal wall surface of the vacuum processing vessel and the like, either. Specifically, the filling gas can be preferably selected from the inert gases such as Ar, He, Ne, Xe, and Kr, or $H_2$, $N_2$, and so on, which are easy to handle.

In the method of the present invention, the internal pressure difference, which is utilized in preventing the by-products and the like of vacuum processing from the different pressure-reduced space from mixing into the vacuum processing vessel, is preferably determined so that the pressure P1 (Pa) during the movement of the vacuum processing vessel and the pressure P2 (Pa) of the different pressure-reduced space to be connected after the movement satisfy the following relation:

$$P1-P2 \geq 0.1 \text{ Pa};$$

further, the internal pressure difference is more preferably set larger so that the pressures P1 and P2 satisfy the following relation:

$$P1-P2 \geq 1 \text{ Pa}.$$

This internal pressure difference is determined with the intention of forming a weak gas flow from the vacuum processing vessel toward the different pressure-reduced space, e.g., toward the exhauster and thus makes it feasible to prevent the migration of the by-products and the like of vacuum processing from the different pressure-reduced space, e.g., from the exhauster into the vacuum processing vessel, which readily occurs particularly immediately after opening of the first opening.

The problem avoided by the action of the present invention described above is the problem intrinsic to the vacuum processing in which the vacuum processing vessel is movable, the vacuum processing vessel is moved with the article being placed therein, the first opening is connected to the second opening provided in a communicable state in the pressure-reduced space different from this vacuum processing vessel, and thereafter the first opening is opened to carry out at least one step of the vacuum processing steps. For example, in the system illustrated in FIG. 4 in which the vacuum vessel and exhauster are of the separable structure, the problem solved by the present invention will not appear noticeable if the vacuum processing is carried out in the state in which the movable reaction vessel section 501 is always connected to the exhaust section 502. Namely, during the period in which the reaction vessel and exhauster are always connected, the step of cleaning the interior of the reaction vessel 506 by dry etching or the like is carried out at stages where the cleanliness in the reaction vessel 506 becomes below a desired level. During this cleaning step, the interior of the exhaust pipe of the exhaust section 502 is also cleaned by etching gas or active species thereof, at the same time as the cleaning of the interior of the reaction vessel 506. As a result, the cleanliness in the exhaust pipe of the exhaust section 502 also recovers at the same frequency as the reaction vessel 506. Accordingly, the by-products and the like of vacuum processing are inherently not accumulated in the exhaust pipe of the exhaust section 502 and thus the migration of the by-products of vacuum processing into the reaction vessel as described above is originally suppressed to a very small amount.

On the other hand, the vacuum processing method of the present invention exhibits the prominent effect, for example, when favorably utilized in alternately and incessantly carrying out vacuum processing in such a manner that a plurality of vacuum processing vessels are prepared, a vacuum processing vessel is moved with an article being placed therein, the vacuum processing vessel is connected to a pressure-reduced space different therefrom, and thereafter at least one step of vacuum processing steps is carried out. Namely, the vacuum processing method of the present invention presents the outstanding effect particularly in the case of use of the common pressure-reduced space (e.g., exhaust means) to a plurality of vacuum processing vessels, applicable to processing with flexibility; therefore, the method can effectively suppress the migration of the impurities such as the dust produced during the movement of the vacuum processing vessel and the by-products of vacuum processing into the vacuum processing vessel and also suppress the degradation of the vacuum processing characteristics and the variability in the vacuum processing characteristics among lots.

Figure 4:
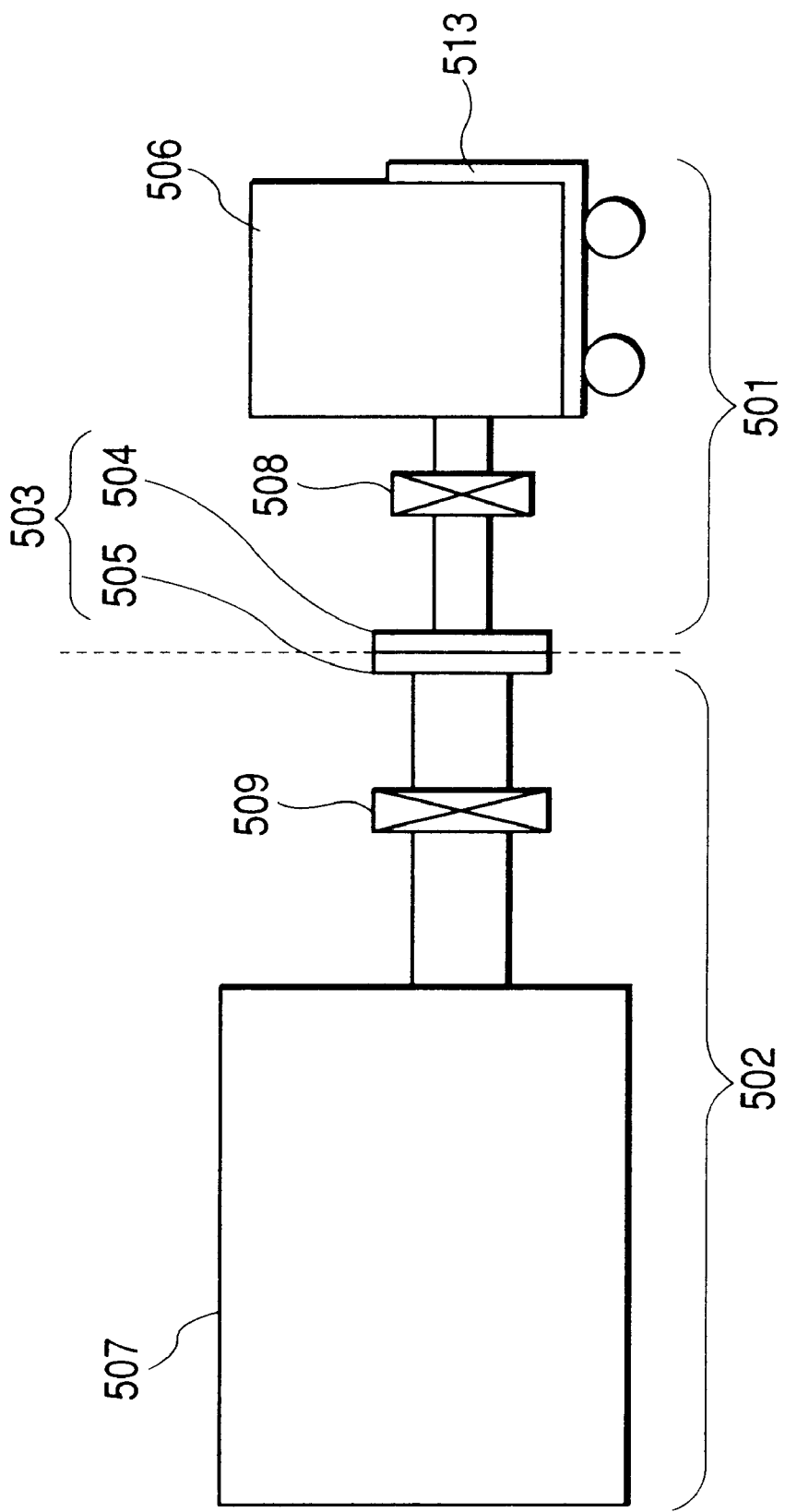
FIG. 4 is a view schematically showing an example of a vacuum processing system having a movable vacuum processing vessel and an exhauster.

It can be speculated that the migration of the dust and impurities into the vacuum processing vessel can be also suppressed to some extent by methods other than the approach of the present invention, for example, by such a modification of the system illustrated in FIG. 4 that the length of the pipe is set long between the first opening 504 provided in the vacuum processing vessel 501 and the main body 506 of the vacuum processing vessel. However, when the pipe length is set long between the main body of the vacuum processing vessel and the first opening, the entire apparatus of the vacuum processing vessel 501 becomes larger. For this reason, the movement of the movable reaction vessel section 501 becomes hard, operability of replacement and mounting works becomes worse, and productivity can be lowered in certain cases. The method of the present invention makes it feasible to present the above effect without causing the increase in the scale of the apparatus, the deterioration of workability and operability, or the drop of productivity.

In the vacuum processing method of the present invention, a more outstanding effect can be achieved by carrying out an operation of, after opening the first opening to establish the communication, varying the exhaust resistance between the vacuum processing vessel and the different pressure-reduced space provided with the second opening. This variation of the exhaust resistance controls the flow of gas from the vacuum processing vessel toward the second opening, thereby suppressing occurrence of rapid gas flow. As a result, it becomes feasible to more effectively suppress the floating of dust in the vacuum processing vessel or the migration of the floating by-products and the like of vacuum processing into the vacuum processing vessel, which can be readily caused by the rapid gas flow. This operation of changing the exhaust resistance is preferably control of continuously and/or stepwise reducing the exhaust resistance between the vacuum processing vessel and the different pressure-reduced space provided with the second opening. Namely, when the difference between the pressure in the vacuum processing vessel and the pressure in the different pressure-reduced space, i.e., the internal pressure difference is relatively large, the exhaust resistance is maintained high, so as to suppress the rapid flow of gas from the vacuum processing vessel into the different pressure-reduced space provided with the second opening. At the stage when the internal pressure difference is reduced to a relatively small value thereafter, the exhaust resistance is lowered according to the decrease of the internal pressure difference. As a result, the exhaust capability inside the vacuum processing vessel, which is evacuated via the different pressure-reduced space, is enhanced to a desired level. By adding this changing operation of exhaust resistance, it becomes feasible to efficiently perform the exhaust operation inside the vacuum processing vessel while enjoying the noticeable effect of the present invention.

The vacuum processing method of the present invention demonstrates its effects particularly noticeable when the vacuum processing includes at least a deposited film forming step. When the vacuum processing includes the deposited film forming step, a coating of deposited film, i.e., attachment of by-products occurs, in addition to the internal wall of the vacuum processing vessel, near the second opening communicating therewith and also in the different pressure-reduced space provided with the second opening. The by-products and the like adhering and accumulated readily produce flakes because of peeling and thus migrate as dust and impurities into the vacuum processing vessel. Since the vacuum processing method of the present invention effectively suppresses the phenomenon that the by-products and the like accumulated near the second opening and in the different pressure-reduced space provided with the second opening migrate as dust and impurities into the vacuum processing vessel, its effects become noticeable particularly in the vacuum processing including the deposited film forming step.

When the vacuum processing includes a step of forming deposited films having a plurality of regions of different compositions among those of forming deposited films, the method of the present invention becomes more effective. For example, in the case of the vacuum processing of forming two layers of different m compositions, with progress of the vacuum processing step, the by-products produced during formation of the first layer and the by-products produced during formation of the second layer are successively deposited near the second opening or in the pressure-reduced space provided with the second opening. For the vacuum processing of the next cycle, the vacuum processing vessel with a new article being placed therein is connected. On this occasion, the by-products produced during the previous formation of the second layer attach near the second opening and on the outermost surface of the internal wall of the different pressure-reduced space provided with the second opening and they are impurities easiest to migrate into the vacuum processing vessel. If the next formation of the deposited film of the first layer should be carried out under the situation in which the by-products produced during the previous formation of the second layer are in the vacuum processing vessel, since the by-products produced during the formation of the second layer normally contain elements different from those in the deposited film of the objective first layer, the elements would be included as impurities in the first layer. It can often result in considerable degradation of the characteristics or variability in the characteristics among lots. Since the vacuum processing method of the present invention effectively suppresses the migration of the impurities originating in the depositions near the second opening and on the internal wall of the different pressure-reduced space provided with the second opening, its effects become more noticeable, particularly, when the vacuum processing includes the step of forming the deposited films having the plural regions of different compositions.

Accordingly, the vacuum processing method of the present invention is particularly effective when the vacuum processing is formation of deposited films for forming a photosensitive member for electrophotography. Since the photosensitive member for electrophotography to be produced is normally constructed utilizing the structure in which deposited films of different compositions are stacked, it is a typical example of the aforementioned vacuum processing including the step of forming the deposited films having the plural regions of different compositions. In addition, since the deposited films themselves are normally formed as deposited films having the total thickness of several ten µm, the amount of the by-products near the second opening or on the internal wall of the different pressure-reduced space provided with the second opening becomes very large per deposition step. As a result, as described above, the system is in such a state that the dust and impurities originating in the by-products attaching there are easier to migrate into the vacuum processing vessel. By applying the vacuum processing method of the present invention, even in such cases, the method effectively suppresses the migration of the dust and impurities into the vacuum processing vessel and the mixing of the foreign elements into the deposited film along therewith, thus exhibiting the noticeable effects.

An embodiment of the vacuum processing method of the present invention presenting such effects will be described below in more detail with reference to the drawings.

Figure 6:
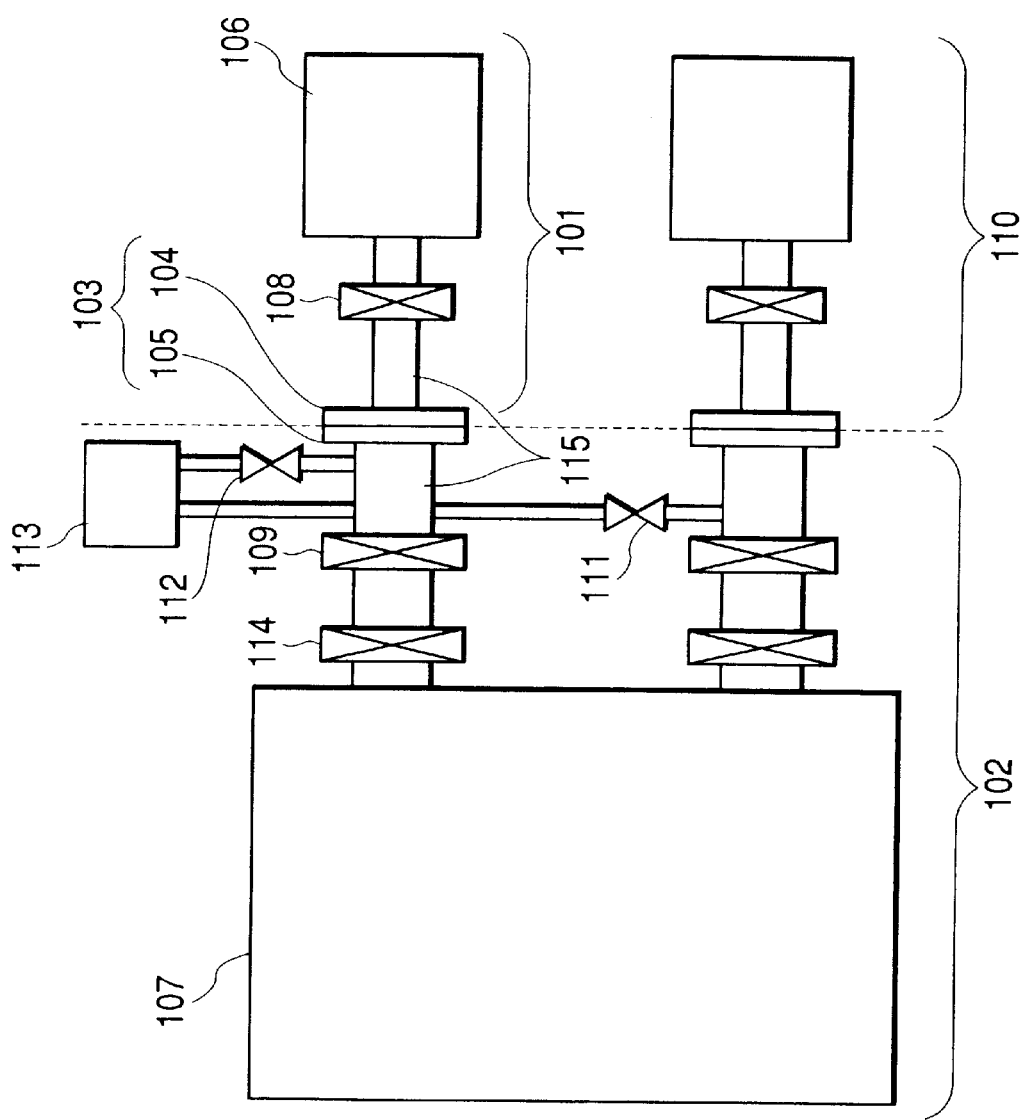
FIG. 6 is a view schematically showing a vacuum processing system having a plurality of movable vacuum processing vessels and an exhaust section.

FIG. 6 is a schematic view showing an example of vacuum processing apparatus capable of favorably carrying out the vacuum processing method of the present invention. This vacuum processing system of FIG. 6 is constructed in the structure in which an exhaust section 102 and reaction vessel sections are separable from each other. In the separated state, the reaction vessel section is arranged as movable. In FIG. 6, numeral 101 designates a first movable reaction vessel section, which consists of a reaction vessel 106, a vacuum seal valve 108, and a connection flange 104 and which is movable. Numeral 102 denotes an exhaust section, which consists of an exhaust means 107, vacuum seal valves 109, and connection flanges 105. Numeral 103 represents a connection section for connection between the reaction vessel section 101 and the exhaust section 102. Numeral 110 indicates a second movable reaction vessel section, which has the structure similar to that of the first movable reaction vessel section 101.

The first movable reaction vessel section 101 and the second movable reaction vessel section 110 can be connected each to the exhaust section 102 at respectively different connection sections. They can be arranged so that the vacuum processing is carried out simultaneously and in parallel therein or so that the vacuum processing is carried out alternately in each of them. The structure in the reaction vessel 106 is constructed so as to properly match the purpose of use, according to the objective vacuum processing. For example, for the purpose of forming deposited films on plural substrates by the plasma CVD method, the structure illustrated in FIGS. 5A and 5B can be used, for example. Numeral 113 denotes an auxiliary exhauster, which is used for evacuating pipes 115 between the reaction-vessel-side vacuum seal valve 108 and the exhaust-section-side vacuum seal valve 109 after the connection of the reaction vessel sections 101 and 110 to the exhaust section 102. The auxiliary exhauster 113 is arranged to be able to start or stop the evacuation through valves 111 and 112. Numeral 114 represents a conductance varying valve, by which the exhaust resistance can be varied on the occasion of evacuating the interior of the reaction vessel 106 by the exhaust means 107.

When in this system as illustrated in FIG. 6 the reaction vessels 106 are of the structure illustrated in FIGS. 5A and 5B, the vacuum processing method of the present invention can be carried out, for example, according to the procedures described below.

First, the movable reaction vessel section 101, in the disconnected state from the exhaust section 102, is connected to an exhauster for loading of substrate (not shown), by use of the connection flange 104. In this state, cylindrical substrates 605 are loaded into the reaction vessel 601. Then, the interior of the reaction vessel 601 is evacuated through the exhaust duct 611 linking to the vacuum seal valve 108, using the substrate-loading exhauster connected thereto. During execution of this evacuation, the vacuum seal valve 108 is kept open. The evacuation of the interior of the reaction vessel 601 is terminated by closing the vacuum seal valve 108 under such a condition that the pressure inside the reaction vessel 601 is in a pressure-reduced state and that, on the occasion of thereafter connecting the reaction vessel section 101 to the exhaust section 102 and then opening the vacuum seal valve 108 to establish the communication between them, the pressure inside the reaction vessel 601 becomes higher than the pressure on the exhaust section side.

The exhaust-section-side pressure P2 and the pressure P1 in the reaction vessel 601 are normally preliminarily selected in such a range that the pressure difference P1–P2 becomes not less than the predetermined value and that P1 itself becomes not more than a predetermined degree of pressure reduction (pressure), on the occasion of connecting the vacuum vessel section 101 to the exhaust section 102 and thereafter opening the vacuum seal valve 108 to establish the communication.

Alternatively, the reaction vessel section 101 can also be carried with the reaction vessel 601 being filled with desired gas, to the exhaust section 102. In this case, the cylindrical substrates 605 are loaded into the reaction vessel 601 and thereafter the interior of the reaction vessel 601 is fully evacuated once through the exhaust duct 611 by the substrate-loading exhauster. Then, the desired gas is introduced through the source gas supply means 612 into the reaction vessel 601. On this occasion, it can also be contemplated that the gas is introduced with the vacuum seal valve 108 being kept in the open state, the gas is flowed for a desired period, and thereafter the vacuum seal valve is closed whereby the interior of the reaction vessel 601 is set in the aforementioned pressure range. As another approach, the interior of the reaction vessel 601 may also be set in the aforementioned pressure range by preliminarily closing the vacuum seal valve 108 after the evacuation and introducing the desired gas through the source gas supply means 612 into the reaction vessel 601. In a further applicable method, the gas is introduced through the source gas supply means 612 into the reaction vessel 601 to fill the interior of the reaction vessel 601 with the desired gas to a predetermined pressure, thereafter the vacuum seal valve 108 is again opened to reduce the pressure to a desired pressure, and then the vacuum seal valve 108 is closed.

In either case of the above procedures, the pressure inside the reaction vessel 601 is maintained in the pressure-reduced state before completion of the movement of the reaction vessel section 101 to the exhaust section 102 and the pressure inside the reaction vessel 601 is kept in the higher state than the exhaust-section-side pressure upon opening of the vacuum seal valve 108 after the connection of the reaction vessel section 101 to the exhaust section 102. Accordingly, the method may also be arranged, for example, to heat the cylindrical substrates 605 to a predetermined temperature by the heaters 607 and thereafter carry out either of the aforementioned procedures to set the interior of the reaction vessel 601 to the predetermined pressure.

After the pressure in the reaction vessel 601 reaches the predetermined value and the vacuum seal valve 108 is then closed, the connection flange 104 is disconnected from the substrate-loading exhauster. Then, the movable reaction vessel section 101 is moved to the installation site of the exhaust section 102 and the connection flange 104 is connected through a vacuum seal material to the exhaust-section-side connection flange 105.

After the connection, in order to make the connection section airtight, the flanges are fixed to each other, using such fixing means as screws, clamps, or the like provided at need in the apparatus per se. After it is confirmed that the movable reaction vessel section 101 is connected to the exhaust section 102, the pipes 115 between the exhaust-section-side vacuum seal valve 109 and the reaction-vessel-side vacuum seal valve 108 are evacuated. A specific evacuation procedure may be a method of opening the valve 112 to evacuate the pipes to a predetermined pressure by the auxiliary exhauster 113, or a method of roughly reducing the pressure by the auxiliary exhauster 113 and thereafter opening the exhaust-section-side vacuum seal valve 109 to evacuate the pipes by the exhaust means 107. The evacuation decreases the pressure inside the pipes 115 to below the pressure inside the reaction vessel 601 and the evacuation is switched to that by the exhaust means 107. After it is confirmed that the pressure is lowered to a predetermined exhaust-section-side pressure, the reaction-vessel-side vacuum seal valve 108 is opened.

Accordingly, in the case wherein the evacuation of the pipes 115 between the exhaust-section-side vacuum seal valve 109 and the reaction-vessel-side vacuum seal valve 108 is carried out by the auxiliary exhauster 113, the valve 112 is closed and the exhaust-section-side vacuum seal valve 109 is opened. On the occasion of opening the exhaust-section-side vacuum seal valve 109, the pressure on the exhaust means 107 side is preferably set lower than the pressure in the part of pipes 115. For selecting a procedure of opening the vacuum seal valve 109 at the stage when there is no difference between them or when the pressure in the part of pipes 115 is lower, the exhaust pipe is constructed in so long length between the exhaust-section-side vacuum seal valve 109 and the connection flange 105 that the dust and impurities flying from the exhaust means 107 are prevented from migrating over the joint part, for example, up to the position of the reaction-vessel-side vacuum seal valve 108. The migration of the dust and impurities into the reaction vessel 106 can be prevented surer by also employing the procedure and the configuration of the exhaust section 102 for suppressing the back flow of the dust and impurities from the exhaust section side toward the reaction vessel on the occasion of opening the exhaust-section-side vacuum seal valve 109.

On the occasion of opening the exhaust-section-side vacuum seal valve 109, the conductance varying valve 114 is preferably controlled so that the exhaust resistance is high in the initial stage of evacuation and then the exhaust resistance is gradually decreased, from the aspect of preventing the rapid gas flow. Likewise, on the occasion of opening the reaction-vessel-side vacuum seal valve 108, the conductance varying valve 114 is also preferably controlled so that the exhaust resistance is high in the initial stage of evacuation and then the exhaust resistance is gradually lowered, from the aspect of preventing the rapid gas flow.

After completion of the above preparation, the vacuum processing steps are initiated. For example, when the vacuum processing is a process of preparing a cylindrical substrate as an article and forming a deposited film on this substrate by the plasma CVD method, the vacuum processing steps can be carried out according to the procedures described below, in the structure of the reaction vessel 106 as illustrated in FIG. 6.

After completion of the connection and communication operation between the movable reaction vessel section 101 and the exhaust section 102, substrates are placed in the reaction vessel 106 and the interior of the reaction vessel 106 is in the evacuated state by the exhaust means 107. In this state, the cylindrical substrates 605 are heated and controlled to a predetermined temperature by the heaters 607. When the cylindrical substrates 605 reach the predetermined temperature, the source gas is introduced through the source gas supply means 612 into the reaction vessel 601. After the flow rate of the source gas reaches a set flow rate, the exhaust resistance of the conductance varying valve 114 is adjusted to set the pressure in the reaction vessel 601 to a predetermined value. After it is confirmed that the source gas flow rate and the pressure become stable at their respective values by this adjustment operation, the predetermined high frequency power is supplied from the high frequency power supplies 603 and 614 through the respective matching boxes 604, 613 to the cathode electrodes 602, 606. The high frequency power thus supplied brings about glow discharge in the reaction vessel 601 to excite and dissociate the source gas, thereby forming deposited films on the cylindrical substrates 605. After the deposited films are formed in desired thickness, the supply of a high frequency power is terminated and then the supply of source gas is also terminated, thereby completing the formation of first deposited films.

The series of operations described above are carried out several times by selecting deposition conditions according to objective deposited films, thereby forming the multi-layer deposited films used in the photosensitive members for electrophotography consisting of a plurality of layers. Between layers, the operations may also be carried out in such a manner that the discharge is once stopped completely at the time of completion of formation of one layer, the setting of the gas flow rate and pressure is modified according to the deposition conditions of a next layer, and thereafter discharge is again induced for formation of the next layer. In another applicable method, the multiple layers may be continuously formed by gradually changing the set values of the gas flow rate, pressure, and high frequency power within a fixed period according to the deposition conditions of the next layer without interruption after completion of formation of one layer. During the formation of the deposited films, the cylindrical substrates 605 may be rotated at a predetermined speed at need through the rotation shafts 608 by the motors 609.

After completion of the deposited film forming step in this way, the source gas in the reaction vessel 106 and in the exhaust pipes are fully purged or preferably replaced with inert gas. Then, the reaction-vessel-side vacuum seal valve 108 and the exhaust-section-side valve 109 are closed. After that, the part between the exhaust-section-side vacuum seal valve 109 and the reaction-vessel-side vacuum seal valve 108, i.e., the part of pipes 115 is opened to the atmosphere and the connection section 103 is disconnected. After disconnected, the movable reaction vessel section 101 becomes movable and then the movable reaction vessel section 101 is moved to the substrate unloading site.

As the need arises, the substrates 605 are cooled to a desired temperature and then the inert gas or the like is introduced through the unrepresented leak valve into the reaction vessel 106, thereby returning the internal pressure of the reaction vessel 106 to the atmospheric pressure. After the interior of the reaction vessel 106 reaches the atmospheric pressure, the substrates 605 with the deposited films thereon are taken out of the reaction vessel 106.

After that, the components in the reaction vessel 106 are subjected to replacement, cleaning, etc., whereby the reaction vessel 106 is recovered into the state permitting the formation of deposited films. For the next vacuum processing, the reaction vessel 106 is again transferred to the above-stated substrate loading process.

In the series of vacuum processing steps as described above, the vacuum processing can be carried out more efficiently by provision of a plurality of movable reaction vessel sections and, for example, by simultaneous and parallel execution of vacuum processing in the reaction vessel section 101 and in the reaction vessel section 110. In another applicable method, at the stage when the reaction vessel section 101 is disconnected from the exhaust section 102 after completion of the formation of deposited films in the reaction vessel section 101 connected to the exhaust section 102, the reaction vessel section 110 is connected to the exhaust section 102 and the formation of deposited films is then carried out in similar fashion.

In the process of using both the reaction vessel section 101 and the reaction vessel section 110 and sequentially carrying out the vacuum processing steps therein, for example, during the period in which the exhaust-section-side vacuum seal valve 109 communicating with one reaction vessel section 101 is opened, the exhaust-section-side vacuum seal valve communicating with the other reaction vessel section 110 is kept in the closed state.

EXAMPLES

The present invention will be described below in further detail with examples thereof. It is noted that these examples are intended to provide examples of best embodied forms of the present invention but the present invention is by no means intended to be limited to these examples.

Example 1

Figure 5A:
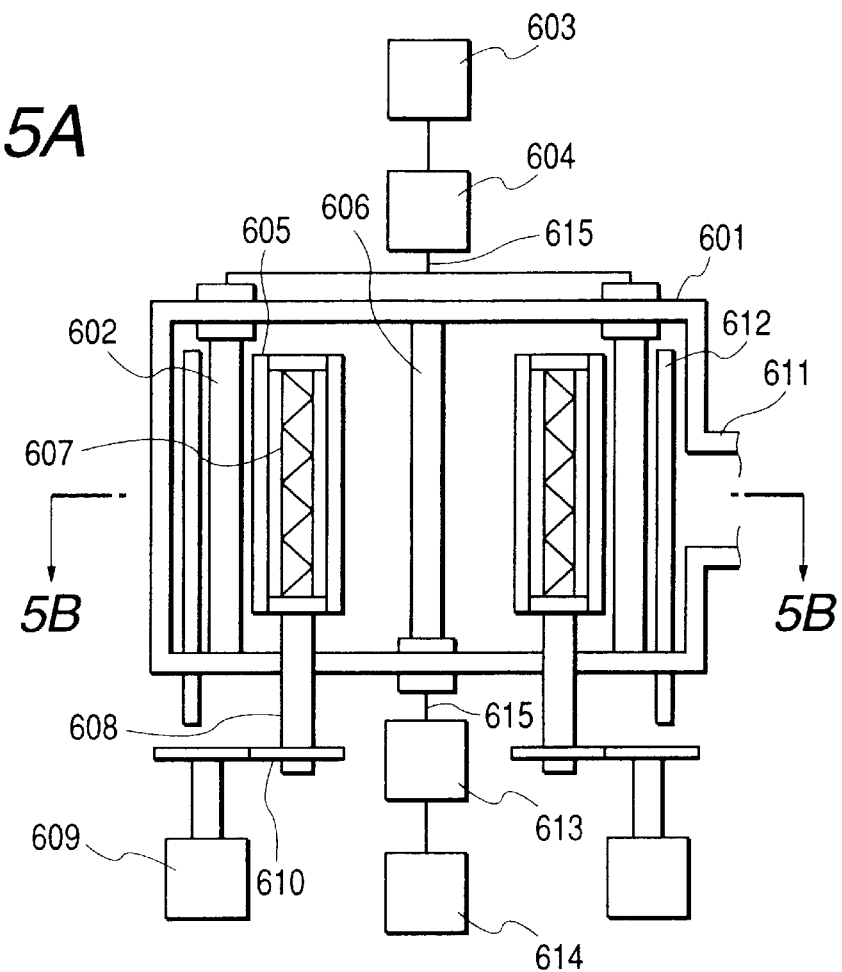
Figure 5B:
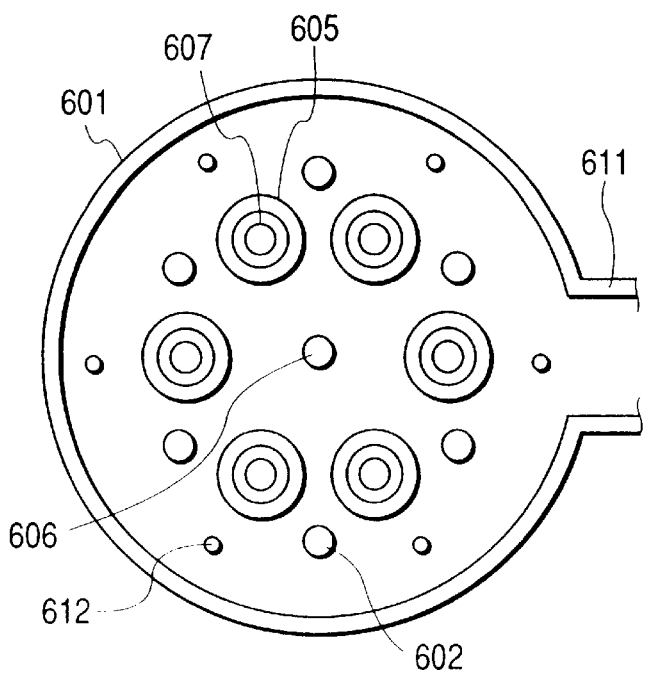

Deposited films were formed on cylindrical substrates, specifically, on cylindrical aluminum cylinders 605 having the diameter of 80 mm and the length of 358 mm, by the plasma CVD method, using the vacuum processing system illustrated in FIG. 6 and using the reaction vessels for production of photosensitive members for electrophotography, illustrated in FIGS. 5A and 5B, as the reaction vessels 106. The a-Si deposited films were formed under the deposition conditions presented in Table 1, while setting the oscillation frequency of the high frequency power supplies 603 and 614 to 100 MHz. In Table 1, the power indicates the total of the powers supplied from the high frequency power supply 603 and from the high frequency power supply 614. For the purpose of use in evaluation of film quality of the deposited films, particularly, for use in evaluation of the electric characteristics, a Corning #7059 glass substrate having a comb-shaped electrode of Cr with gaps of 250 µm evaporated thereon was placed as an electric characteristic evaluating substrate in the axial center on the surface of each of the six cylindrical substrates. The cathode electrodes 602, 606 were SUS cylinders having the diameter of 20 mm and constructed in structure where the outside was covered by an alumina pipe having the inside diameter of 21 mm and the outside diameter of 24 mm. The alumina pipes were processed by blasting so that the surface roughness thereof, Rz, was 20 µm on the basis of the reference length of 2.5 mm.

The source gas supply means 612 were alumina pipes having the inside diameter of 10 mm and the outside diameter of 13 mm and were constructed in such structure that their ends were sealed and a lot of gas outlets having the diameter of 1.2 mm were provided on the pipes so as to be able to uniformly supply the source gas in the circumferential direction. The surfaces of the source gas supply means 612 were also processed by blasting so that the surface roughness thereof, Rz, was 20 µm on the basis of the reference length of 2.5 mm.

The deposited film forming steps were carried out according to the procedures schematically described below, using the deposited film forming apparatus described above.

First, the movable reaction vessel sections 101, 110 were connected through their connection flanges 104 to the substrate-loading exhauster (not shown), and at the same time, Ar supplying pipes (not shown), and power supply lines to the reaction vessel sections 101, 110 were also connected. In this state, the cylindrical substrates 605 were loaded into each reaction vessel 601 (106). Then, the vacuum seal valve 108 was opened to evacuate the interior of the reaction vessel 601 through the exhaust duct 611 by the substrate-loading exhauster. After confirming that the interior of the reaction vessel 601 (106) was evacuated to below $1 \times 10^{-3}$ Pa, Ar was supplied at the flow rate of 500 sccm through the source gas supply means 612 into the reaction vessel 601 (106). While the pressure in the reaction vessel was maintained at 70 Pa by an unrepresented pressure regulating valve, the cylindrical substrates 605 were heated and controlled to 250° C. by the heaters 607. The heating state of the substrates under this pressure-reduced Ar atmosphere was maintained for two hours. During this period the cylindrical substrates 605 were rotated at the speed of 10 rpm via the rotation shafts 608 and gears 610 by the motors 609. During the Ar supply start period the flow rate of Ar was linearly increased from 0 sccm to 500 sccm in 5 minutes.

Then, the supply of Ar was stopped, and at the time when the internal pressure of the reaction vessel 601 (106) became 60 Pa, the vacuum seal valve 108 was closed and the heating of the substrates 605 by the heaters 607 was terminated. After that, the connection flange 104 was disconnected from the substrate-loading exhauster, and the Ar supplying pipe (not shown) connected to the source gas supply means 612, and the power supply lines to the reaction vessel 601 were also disconnected. By the above operation, the interior of the movable reaction vessel sections 101, 110 was filled with Ar gas and maintained in the pressure-reduced state of the internal pressure of 60 Pa.

After the above operation, the movable reaction vessel sections 101 and 110 were moved to the installation site of the exhaust section 102 and their connection flanges 104 were connected through a Viton O-ring (vacuum seal) to the exhaust-side connection flanges 105. After that, the connection sections 103 were fixed by clamps. The source gas supply pipes (not shown) were connected to the source gas supply means 612, and the power supply lines and high frequency power supply cables were further connected to the reaction vessel sections 101 and 110.

After completion of these connection operations, the exhaust-side vacuum seal valves 109 were first opened to evacuate the interior of the pipes 115 by the exhaust means 107. When the pressure in the pipes 115 reached 6 Pa, the reaction-vessel-side vacuum seal valves 108 were opened to evacuate the interior of the reaction vessels 106 to below $1 \times 10^{-3}$ Pa. On this occasion, the conductance varying valves 114 were kept in the full open state.

In the next place, while the cylindrical substrates 605 were rotated at the speed of 10 rpm via the rotation shafts 608 and gears 610 by the motors 609, Ar was supplied at the flow rate of 500 sccm through the source gas supply means 612 into the reaction vessels 601 and the pressure in the reaction vessels was adjusted to 70 Pa by the conductance varying valves 114. While the internal pressure was maintained in the reduced pressure of 70 Pa, the cylindrical substrates 605 were again heated and controlled to 250° C. by the heaters 607 and that state was maintained for 20 minutes. During the Ar supply start period, the flow rate of Ar was linearly increased from 0 sccm to 500 sccm in 5 minutes.

After that, the supply of Ar was stopped and the source gas under the condition presented in Table 1 was introduced through the source gas supply means 612. After the flow rate of the source gas reached the set flow rate, the conductance varying valves 114 were adjusted to set the pressure in the reaction vessels to the condition of Table 1. After confirming that the pressure in the reaction vessels 601 (106) became stable, the total output of the high frequency power supplies 603 and 614 was set to the power presented in Table 1 and the high frequency power was supplied through the matching boxes 604 and 613 to the cathode electrodes 602 and 606. The high frequency power radiated from the cathode electrodes 602 and 606 into the reaction vessels 601 (106) induced plasma discharge to excite and dissociate the source gas, thereby depositing the a-Si deposited films on the cylindrical substrates 605. After that, the supply of the high frequency power was terminated when the deposited films had the thickness of 1 $\mu$m. Then, the supply of the source gas was terminated to end the formation of deposited films. (The end of deposition can be determined, for example, by monitoring the thickness of the deposited films and defining the end at a desired thickness, 1 $\mu$m herein, or by preliminarily measuring a deposition rate per unit time and defining the end at a deposition forming time corresponding to a desired thickness.)

After completion of the deposited film forming step in this way, the source gas inside the reaction vessels 601 (106) and in the source gas supply pipes was fully purged and then the vacuum seal valves 108 and 109 were closed. Then, He was introduced into the reaction vessels 601 (106) thus hermetically closed, up to the internal pressure of 1000 Pa. After that, the connection sections 103 were disconnected and the source gas supply pipes, power supply lines, and high frequency power supply cables were also disconnected, thus bringing the reaction vessel sections 101 and 110 into the movable state.

Then, the reaction vessel sections 101 and 110 were moved to the substrate unloading site and the substrates 605 were cooled to room temperature. Then, nitrogen was introduced through the unrepresented leak valves into the reaction vessels 601 (106) before the interior of the reaction vessels 601 (106) reached the atmospheric pressure. After the interior of the reaction vessels 601 (106) reached the atmospheric pressure, the substrates 605 with the deposited films thereon were taken out of the interior of the reaction vessels 601 (106).

After that, the reaction vessels 601 (106) after completion of the series of a-Si deposited film forming steps were restored by exchange of the internal components thereof whereby the reaction vessels 601 (106) were again brought into the deposition film formable state.

Five lots of a-Si deposited films were formed under the conditions presented in Table 1 as described above, thereby obtaining totally sixty samples for evaluation of the electric characteristics.

Comparative Example 1

The a-Si deposited films were made under the conditions presented in Table 1 in much the same manner as in Example 1 except that, after the connection between the reaction vessel sections 101 and 110 and the exhaust section 102, the exhaust-side vacuum seal valves 109 were opened to evacuate the interior of the pipes by the exhaust means 107 and the reaction-vessel-side vacuum seal valves 108 were then opened at the point when the pressure in the pipes 115 became 600 Pa. In this Comparative Example 1, five lots of deposited films were formed, thereby obtaining totally sixty samples for evaluation of electric characteristics.

The electric characteristic evaluating samples obtained in Example 1 and Comparative Example 1 were evaluated as follows and their characteristics were compared with each other.

Evaluation of Density-of-states

The density-of-states was measured in the range from the valence band edge to 0.8 eV above the valence band edge (on the conduction band side) by CPM (Constant Photocurrent Method). Therefore, the smaller the value of density-of-states, the better the characteristics of deposited film.

From the results of the evaluation of density-of-states, the sixty electric characteristic evaluating samples obtained in Example 1 all were able to be evaluated, whereas seven out of the sixty electric characteristic evaluating samples obtained in Comparative Example 1 were unable to be evaluated. For the seven samples that were unable to be evaluated, their deposited films were observed with an optical microscope and it was found that contamination adhered to the gap portions of the comb-shaped electrodes.

Concerning the density-of-states of the evaluable samples, the average density-of-states of Comparative Example 1 was three times greater than that of Example 1. Concerning variability of density-of-states among the samples, Comparative Example 1 demonstrated greater variability.

It was verified from the above comparison results that application of the vacuum processing method of the present invention presented the effect of suppressing the dust attachment to the vacuum-processed articles and the effect of improvement in the vacuum processing characteristics.

TABLE 1

| Gas species and flow rate | $SiH_4$: 500 sccm |
|---|---|
| Substrate temperature | 250° C. |
| Internal pressure of reaction vessel | 1.3 Pa |
| High frequency power | 800 W |
| Film thickness | 1 $\mu$m |

Example 2

Deposited films were formed on cylindrical substrates, specifically, on cylindrical aluminum cylinders 605 having the diameter of 80 mm and the length of 358 mm, by the plasma CVD method, using the vacuum processing system illustrated in FIG. 6 and using the reaction vessels for production of photosensitive members for electrophotography, illustrated in FIGS. 5A and 5B, as the reaction vessels 106. The a-Si based deposited films (photosensitive members) were formed under the deposition conditions presented in Table 2, while setting the oscillation frequency of the high frequency power supplies 603 and 614 to 100 MHz. In Table 2, the power indicates the total of the powers supplied from the high frequency power supply 603 and from the high frequency power supply 614. The cathode electrodes 602, 606 were SUS cylinders having the diameter of 20 mm and constructed in structure where the outside was covered by an alumina pipe having the inside diameter of 21 mm and the outside diameter of 24 mm. The alumina pipes were processed by blasting so that the surface roughness thereof, Rz, was 20 µm on the basis of the reference length of 2.5 mm.

The source gas supply means 612 were alumina pipes having the inside diameter of 10 mm and the outside diameter of 13 mm and were constructed in such structure that their ends were sealed and a lot of gas outlets having the diameter of 1.2 mm were provided on the pipes so as to be able to uniformly supply the source gas in the circumferential direction. The surfaces of the source gas supply means 612 were also processed by blasting so that the surface roughness thereof, Rz, was 20 µm on the basis of the reference length of 2.5 mm.

The deposited film forming steps were carried out according to the procedures schematically described below, using the deposited film forming apparatus described above. In the present example, the deposited films consisting of a charge injection blocking layer, a photoconductive layer, and a surface layer were sequentially formed under the deposition conditions presented in Table 2.

First, the movable reaction vessel sections 101, 110 were connected through their connection flanges 104 to the substrate-loading exhauster (not shown), and the Ar supplying pipes (not shown), and the power supply lines to the reaction vessel sections 101, 110 were also connected. In this state, the cylindrical substrates 605 were loaded into the reaction vessels 601 (106). Then, each vacuum seal valve 108 was opened to evacuate the interior of the reaction vessel 601 through the exhaust duct 611 by the substrate-loading exhauster. After confirming that the interior of the reaction vessels 601 (106) was evacuated to below $1 \times 10^{-3}$ Pa, Ar was supplied at the flow rate of 500 sccm through the source gas supply means 612 into the reaction vessels 601 (106). While the pressure in the reaction vessels was maintained at 70 Pa by the unrepresented pressure regulating valves, the cylindrical substrates 605 were heated and controlled to 250° C. by the heaters 607. The heating state of the substrates under this pressure-reduced Ar atmosphere was maintained for two hours. During this period the cylindrical substrates 605 were rotated at the speed of 10 rpm via the rotation shafts 608 and gears 610 by the motors 609. During the Ar supply start period the flow rate of Ar was linearly increased from 0 sccm to 500 sccm in 5 minutes.

Next, the vacuum seal valves 108 were closed, the supply of Ar was stopped, and the reaction vessels 601 (106) were hermetically sealed in the pressure-reduced state. On that occasion, the interior of the reaction vessels 601 (106) was hermetically sealed under the pressure-reduced conditions below by adjusting the closing timing of the vacuum seal valves 108 and the stopping timing of the Ar supply, and thereafter the heating of the substrates 605 by the heaters 607 was terminated. The pressure in the reaction vessels 601 (106) in the pressure-reduced state as filled with Ar was either of seven conditions of $4 \times 10^3$ Pa, $1 \times 10^3$ Pa, $4 \times 10^2$ Pa, $1 \times 10^2$ Pa, $4 \times 10^1$ Pa, $1 \times 10^1$ Pa, and 4 Pa. After that, the connection flanges 104 were disconnected from the substrate-loading exhauster, and the Ar supplying pipes (not shown) are disconnected from the source gas supply means 612, and the power supply lines to the reaction vessels 601 were also disconnected.

After the above operation, the movable reaction vessel sections 101 and 110 were moved to the installation site of the exhaust section 102 and the connection flanges 104 were connected through the Viton O-ring (vacuum seal) to the exhaust-side connection flanges 105. After that, the connection sections 103 were fixed by clamps. The source gas supply pipes (not shown) were connected to the source gas supply means 612 and the power supply lines and high frequency power supply cables were further connected to the reaction vessel sections 101 and 110.

After completion of these connection operations, the exhaust-side vacuum seal valves 109 were first opened to evacuate the interior of the pipes 115 by the exhaust means 107. When the pressure in the pipes 115 became 0.1 times the pressure in the reaction vessels 601 (106), the reaction-vessel-side vacuum seal valves 108 were opened to evacuate the interior of the reaction vessels 106 to below $1 \times 10^{-3}$ Pa. On this occasion, the conductance varying valves 114 were kept in the full open state.

In the next place, while the cylindrical substrates 605 were rotated at the speed of 10 rpm via the rotation shafts 608 and gears 610 by the motors 609, Ar was supplied at the flow rate of 500 sccm through the source gas supply means 612 into the reaction vessels 601 and the pressure in the reaction vessels was adjusted to 70 Pa by the conductance varying valves 114. While reducing the internal pressure to 70 Pa, the cylindrical substrates 605 were again heated and controlled to 250° C. by the heaters 607 and that state was maintained for 20 minutes. During the Ar supply start period, the flow rate of Ar was linearly increased from 0 sccm to 500 sccm in 5 minutes.

After completion of the reheating of the substrates, the supply of Ar was stopped and the source gases under the conditions for the charge injection blocking layer presented in Table 2 were introduced through the source gas supply means 612. After the flow rates of the source gases reached the set flow rates, the conductance varying valves 114 were adjusted to set the pressure in the reaction vessels to the condition in Table 2. After confirming that the pressure in the reaction vessels 601 (106) became stable, the total output of the high frequency power supplies 603 and 614 was set to the power presented in Table 2 and the high frequency power was supplied through the matching boxes 604 and 613 to the cathode electrodes 602 and 606. The high frequency power radiated from the cathode electrodes 602 and 606 into the reaction vessels 601 (106) induced the plasma discharge to excite and dissociate the source gases, thereby starting formation of the charge injection blocking layers on the cylindrical substrates 605. After that, at the point of time when the charge injection blocking layers were formed in the thickness presented in Table 2, the supply of the high frequency power was stopped and then the supply of the source gases was also stopped, thereby terminating the formation of the charge injection blocking layers. After that, similar operation was repeated to form the photoconductive layer and surface layer sequentially, thereby obtaining layered structures.

After completion of the formation of the a-Si based photosensitive members in this way, the source gas inside the reaction vessels 601 (106) and in the source gas supply pipes was fully purged and then the vacuum seal valves 108 and 109 were closed. Then, He was introduced into the reaction vessels 601 (106) thus hermetically closed, up to the internal pressure of 1000 Pa. After that, the connection sections 103 were disconnected and the source gas supply pipes, power supply lines, and high frequency power supply cables were also disconnected, thus bringing the reaction vessel sections 101 and 110 into the movable state.

Then, the reaction vessel sections 101 and 110 were moved to the substrate unloading site and the substrates 605 were cooled to room temperature. Then, nitrogen was introduced through the unrepresented leak valves into the reaction vessels 601 (106) before the interior of the reaction vessels 601 (106) reached the atmospheric pressure. After the interior of the reaction vessels 601 (106) reached the atmospheric pressure, the substrates 605 with the deposited films thereon were taken out of the interior of the reaction vessels 601 (106).

After that, the reaction vessels 601 (106) after completion of the series of a-Si deposited film forming steps were restored by exchange of the internal components thereof whereby the reaction vessels 601 (106) were again brought into the deposition formable state.

In this way, using the two reaction vessel sections 101 and 110, three lots of a-Si based photosensitive members, i.e., 36 members, were formed under the conditions presented in Table 2, for each of the above-stated seven conditions.

Comparative Example 2

The a-Si based photosensitive members were produced under the conditions presented in Table 2 in much the same manner as in Example 2 except that, after the connection of the reaction vessel sections 101 and 110 to the exhaust section, the exhaust-side vacuum seal valves 109 were opened to evacuate the interior of the pipes by the exhaust means 107 and the reaction-vessel-side vacuum seal valves 108 were then opened when the pressure in the pipes became ten times the pressure in the reaction vessels 601 (106). In this Comparative Example 2, three lots of a-Si based photosensitive members, i.e., 36 members were formed for each of the aforementioned seven conditions, using the two reaction vessel sections 101 and 110.

With the a-Si based photosensitive members produced in Example 2 and in Comparative Example 2, each a-Si based photosensitive member was set in a copying machine (trade name: NP-6750; mfd. by CANON Inc.) modified for tests and evaluation was conducted as to each of items, "optical memory," "characteristic variability," and "image defects" described below. The evaluation methods of the respective items will be described below in detail.

"Optical Memory"

The electric current of the main charger was adjusted so that the dark potential at the position of the developing unit became a predetermined value, and image exposure intensity was then adjusted so that the bright potential for an original of a predetermined white sheet became a predetermined value. In this state a ghost test chart (part number: FY9-9040; mfd. by CANON Inc.) provided with glued black dots having the reflection density of 1.1 and the diameter of 5 mm was placed on the original stage and a halftone chart mfd. by CANON Inc. was laid thereon. In this state copy images were obtained and evaluation thereof was conducted by measuring the difference between reflection density of the halftone portions and reflection density of 5 mm-diameter black dots of the ghost chart recognized on the halftone copies.

For each of the photosensitive members, the optical memory was measured across the entire region in the direction along the generator of the photosensitive member and a maximum reflection density difference among measurements was employed as an index of the evaluation. The evaluation was conducted for all the photosensitive members produced under the same conditions and an average thereof was employed as an evaluation result of optical memory.

"Characteristic Variability"

From the maximum reflection density differences of the respective photosensitive members measured in the above evaluation of "optical memory," a maximum and a minimum were extracted from those in all the photosensitive members produced under the same conditions. Then, a ratio of (maximum)/(minimum) was calculated and employed as an index of characteristic variability. Accordingly, smaller values indicate better results of small characteristic variability.

"Image Defects"

A halftone chart (part number: FY9-9042; mfd. by CANON Inc.) was placed on the original stage and copied. White dots having the diameter of not less than 0.1 mm were counted in a fixed area of the copy images obtained. The image defects were evaluated using the number of white dots as an index. Accordingly, smaller values indicate better results.

Table 3 presents the evaluation results. Table 3 shows the results of relative evaluation in five levels on the basis of the results in the condition that the pressure in the reaction vessels 106 was $4 \times 10^3$ Pa, in Comparative Example 2.

"Optical memory" was evaluated by the classification of the following five levels:

⊚ improvement of not less than 20%;

○ improvement of not less than 10% but less than 20%;

Δ improvement of not less than 5% but less than 10%;

▲ improvement of less than 5% or degradation of less than 5%;

× degradation of not less than 5%.

"Characteristic variability" were evaluated by the classification of the following five levels:

⊚ improvement of not less than 40%;

○ improvement of not less than 20% but less than 40%;

Δ improvement of not less than 10% but less than 20%;

▲ improvement of less than 10% or degradation of less than 10%;

× degradation of not less than 10%.

"Image defects" were evaluated by the classification of the following five levels:

⊚ improvement of not less than 80%;

○ improvement of not less than 40% but less than 80%;

Δ improvement of not less than 20% but less than 40%;

▲ improvement of less than 20% or degradation of less than 20%;

× degradation of not less than 20%.

From the results presented in Table 3, when comparison is made between the results under the same conditions of the internal pressure during the movement of the reaction vessels, a definite difference is seen between Example 2 and Comparative Example 2. Therefore, this result ensures the effects of the present invention owing to the setting in which the internal pressure of the reaction vessels is set higher than the pressure of the exhaust section during the connection between the movable reaction vessel sections and the exhaust section. The effects of the present invention appear more prominent when the pressure in the reaction vessels 106 is not more than $1 \times 10^3$ Pa during the movement of the movable reaction vessel sections 101 and 110 to the installation site of the exhaust section 102. Particularly, it was verified that the effects became further prominent at the pressures of not more than $1 \times 10^2$ Pa.

The electrophotographic images formed using the electrophotographic, photosensitive members produced in Example 2 were extremely excellent without image smearing or the like.

TABLE 2

|  | Charge injection blocking layer | Photo-conductive layer | Surface layer |
|---|---|---|---|
| Gas species/flow rate: |  |  |  |
| $SiH_4$ | 200 sccm | 300 sccm | 20 sccm |
| $H_2$ | 200 sccm | 1000 sccm |  |
| $B_2H_6$ | 1000 ppm (over $SiH_4$) | 1.2 ppm (over $SiH_4$) |  |
| $CH_4$ |  |  | 100 sccm |
| NO | 10 sccm |  |  |
| Substrate temperature | 250° C. | 250° C. | 250° C. |
| Internal pressure of reaction vessel | 1.3 Pa | 1.3 Pa | 1.3 Pa |
| High frequency power | 900 W | 1800 W | 750 W |
| Film thickness | 3 µm | 30 µm | 0.5 µm |

TABLE 3

| Internal pressure (Pa) | Example 2 | | | Comparative Example 2 | | |
|---|---|---|---|---|---|---|
|  | Optical memory | Characteristic variability | Image defects | Optical memory | Characteristic variability | Image defects |
| $4 \times 10^3$ | ○ | ○ | Δ | — | — | — |
| $1 \times 10^3$ | ⊚ | ⊚ | ○ | ▲ | ▲ | ▲ |
| $4 \times 10^2$ | ⊚ | ⊚ | ○ | ▲ | ▲ | ▲ |
| $1 \times 10^2$ | ⊚ | ⊚ | ⊚ | ▲ | ▲ | Δ |
| $4 \times 10^1$ | ⊚ | ⊚ | ⊚ | Δ | Δ | Δ |
| $1 \times 10^1$ | ⊚ | ⊚ | ⊚ | Δ | Δ | Δ |
| 4 | ⊚ | ⊚ | ⊚ | Δ | Δ | Δ |

Example 3

Using the vacuum processing system illustrated in FIG. 6, the a-Si based photosensitive members were formed under the conditions presented in Table 2, on cylindrical aluminum cylinders 605 having the diameter of 80 mm and the length of 358 mm in much the same manner as in Example 2, except for the following operations.

In the present example, during the movement of the movable reaction vessel sections 101 and 110 to the installation site of the exhaust section 102, the pressure P1 (Pa) in the reaction vessels 106 was set to 1×10 Pa. After the connection between the movable reaction vessel sections 101 and 110 and the exhaust section 102, the reaction-vessel-side vacuum seal valves 108 were opened when the pressure P2 (Pa) in the pipes 115 evacuated by the exhaust section 102 was measured relative to the pressure P1 (Pa) in the reaction vessels 106 so that the difference P1–P2 between them was either of the five conditions of 4 Pa, 1 Pa, $4\times10^{-1}$ Pa, $1\times10^{-1}$ Pa, and $4\times10^{-2}$ Pa. Using the two reaction vessel sections 101 and 110, three lots of a-Si based photosensitive members, i.e., 36 members were made under each of the five conditions.

Just as in Example 2, each of the a-Si based photosensitive members produced in the present example was also set in a copying machine (trade name: NP-6750; mfd. by CANON Inc.) modified for the tests and evaluated as to the three items of "optical memory," "characteristic variability," and "image defects" in accordance with the aforementioned evaluation methods.

Table 4 presents the evaluation results. Just as in Table 3, Table 4 also shows the results of relative evaluation in five levels on the basis of the results in the condition that the pressure in the reaction vessels 106 was $4\times10^3$ Pa, in Comparative Example 2.

"Optical memory" was evaluated by the classification of the following five levels:

⊚ improvement of not less than 20%;
○ improvement of not less than 10% but less than 20%;
Δ improvement of not less than 5% but less than 10%;
▲ improvement of less than 5% or degradation of less than 5%;
× degradation of not less than 5%.

"Characteristic variability" were evaluated by the classification of the following five levels:

⊚ improvement of not less than 40%;
○ improvement of not less than 20% but less than 40%;
Δ improvement of not less than 10% but less than 20%;
▲ improvement of less than 10% or degradation of less than 10%;
× degradation of not less than 10%.

"Image defects" were evaluated by the classification of the following five levels:

⊚ improvement of not less than 80%;
○ improvement of not less than 40% but less than 80%;
Δ improvement of not less than 20% but less than 40%;
▲ improvement of less than 20% or degradation of less than 20%;
× degradation of not less than 20%.

The results of evaluation ensured the effects of the present invention and verified that the effects of the present invention appeared prominent, particularly, when the pressure P1 (Pa) during the movement of the vacuum processing vessels and the pressure P2 (Pa) of the space to communicate therewith upon opening of the first opening, satisfied the following relation:

$P1-P2 \geq 0.1$ Pa;

and further verified that the effects became more prominent when the pressures satisfied the following relation:

$P1-P2 \geq 1$ Pa.

The electrophotographic images formed using the electrophotographic, photosensitive members produced in Example 3 were extremely excellent without image smearing or the like.

TABLE 4

| Internal pressure difference | Example 3 | | |
|---|---|---|---|
| P1–P2 (Pa) | Optical memory | Characteristic variability | Image defects |
| 4 | ⊚ | ⊚ | ⊚ |
| 1 | ⊚ | ⊚ | ⊚ |
| $4 \times 10^{-1}$ | ○ | ⊚ | ⊚ |

TABLE 4-continued

| Internal pressure difference | Example 3 | | |
|---|---|---|---|
| P1–P2 (Pa) | Optical memory | Characteristic variability | Image defects |
| $1 \times 10^{-1}$ | ○ | ◎ | ◎ |
| $4 \times 10^{-2}$ | ○ | ○ | ○ |

Example 4

Using the vacuum processing system illustrated in FIG. 6, the a-Si based photosensitive members were formed under the conditions presented in Table 2, on cylindrical aluminum cylinders 605 having the diameter of 80 mm and the length of 358 mm In much the same manner as in Example 2, except for the following operations.

Figure 7:
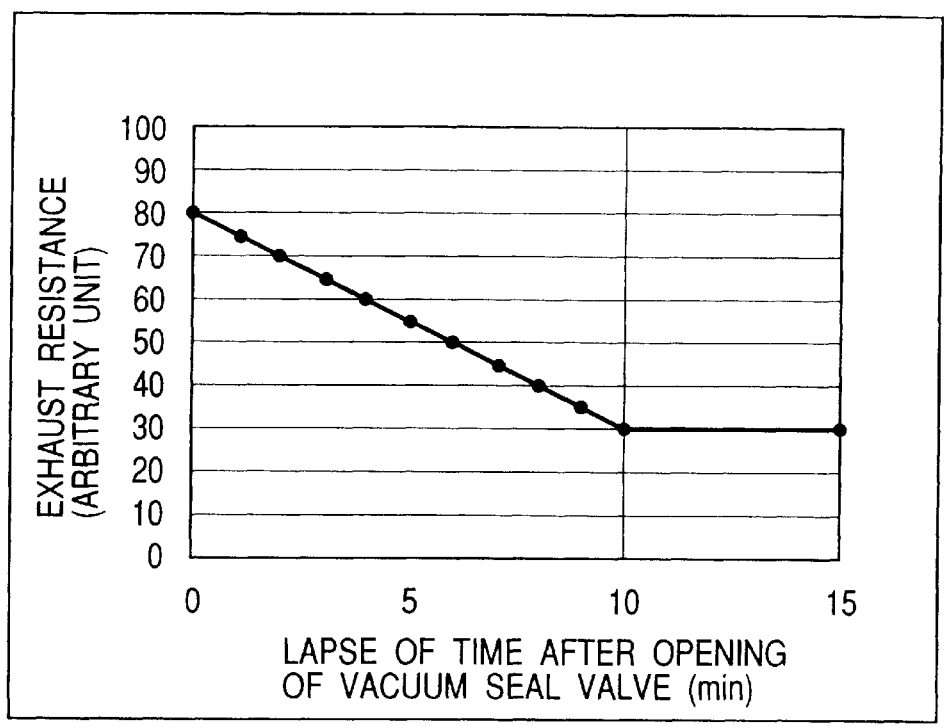
FIG. 7 is a drawing showing an example of variation of an exhaust resistance.

In the present example, during the movement of the movable reaction vessel sections 101 and 110 to the installation site of the exhaust section 102, the pressure P1 (Pa) in the reaction vessels 106 was set at $1 \times 10^3$ Pa. After the connection of the movable reaction vessel sections 101 and 110 to the exhaust section 102, the reaction-vessel-side vacuum seal valves 108 were opened under the condition that the pressure P2 (Pa) in the pipes 115 evacuated by the exhaust section 102 was 0.1 times the pressure P1 (Pa) in the reaction vessels 106, i.e., $1 \times 10^2$ Pa. In addition, after the opening of the reaction-vessel-side vacuum seal valves 108, the aperture rate of the conductance varying valves was continuously changed so as to linearly decrease the exhaust resistance as illustrated in FIG. 7. Using the two reaction vessel sections 101 and 110, three lots of a-Si based photosensitive members, i.e., 36 members were formed according to the aforementioned operation procedures.

Just as in Example 2, each of the a-Si based photosensitive members produced in the present example was also set in a copying machine (trade name: NP-6750; mfd. by CANON Inc.) modified for the tests and evaluated as to the three items of "optical memory," "characteristic variability," and "image defects" in accordance with the aforementioned evaluation methods.

Table 5 presents the evaluation results. Just as in Table 3, Table 5 also shows the results of relative evaluation in five levels on the basis of the results in the condition that the pressure in the reaction vessels 106 was $4 \times 10^3$ Pa, in Comparative Example 2.

"Optical memory" was evaluated by the classification of the following five levels:
- ◎ improvement of not less than 20%;
- ○ improvement of not less than 10% but less than 20%;
- Δ improvement of not less than 5% but less than 10%;
- ▲ improvement of less than 5% or degradation of less than 5%;
- × degradation of not less than 5%.

"Characteristic variability" were evaluated by the classification of the following five levels:
- ◎ improvement of not less than 40%;
- ○ improvement of not less than 20% but less than 40%;
- Δ improvement of not less than 10% but less than 20%;
- ▲ improvement of less than 10% or degradation of less than 10%;
- × degradation of not less than 10%.

"Image defects" were evaluated by the classification of the following five levels:
- ◎ improvement of not less than 80%;
- ○ improvement of not less than 40% but less than 80%;
- Δ improvement of not less than 20% but less than 40%;
- ▲ improvement of less than 20% or degradation of less than 20%;
- × degradation of not less than 20%.

The results of the present example shown in Table 5 were compared with the results of the samples made in such a manner that up on opening of the reaction-vessel-side vacuum seal valves 108 under the condition of P1=$1 \times 10^3$ Pa and P2=$1 \times 10^2$ Pa, the conductance varying valves were preliminarily fully opened (where the exhaust resistance was equivalent to the value indicated by 30 in FIG. 7) and thereafter the evacuation was continued at the constant exhaust resistance without change of the aperture rate, in Example 2. The both examples demonstrated prominent improvements in all the three items of "optical memory," "characteristic variability," and "image defects," and the present example exhibited the better result in "image defects." This verified that the vacuum processing method of the present invention demonstrated the more prominent effects of the present invention by employing such procedures that during the period of, after the connection between the reaction vessel sections 101 and 110 with the substrates therein, and the exhaust section 102, opening the reaction-vessel-side vacuum seal valves 108 to establish the communication between the reaction vessel sections and the exhaust section, the exhaust resistance was first set large to limit the exhaust quantity of the exhaust section and thereafter the exhaust resistance was continuously decreased with progress of evacuation.

The electrophotographic images formed using the electrophotographic, photosensitive members produced in Example 4 were extremely excellent without image smearing or the like.

TABLE 5

| Internal pressure P1 (Pa) | Example 4 | | |
|---|---|---|---|
| | Optical memory | Characteristic variability | Image defects |
| $1 \times 10^3$ | ◎ | ◎ | ◎ |

Example 5

Using the vacuum processing system illustrated in FIG. 6, the a-Si based photosensitive members were formed under the conditions presented in Table 2, on cylindrical aluminum cylinders 605 having the diameter of 80 mm and the length of 358 mm in much the same manner as in Example 4, except for the following operations.

Figure 8:
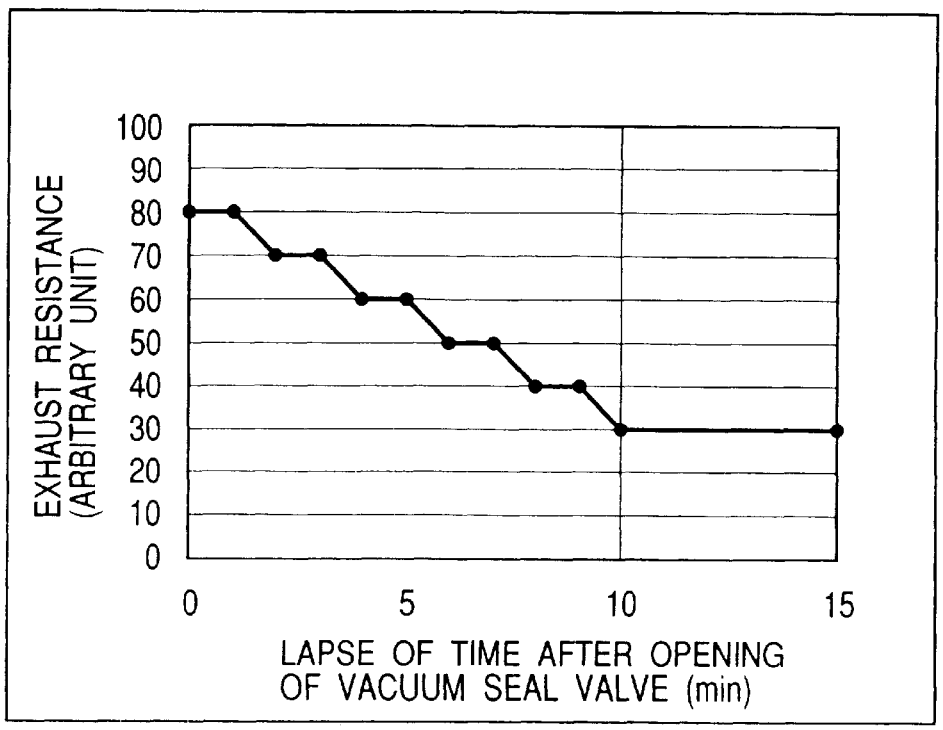
FIG. 8 is a drawing showing another example of variation of an exhaust resistance.

In Example 4, after the opening of the reaction-vessel-side vacuum seal valves 108, the aperture rate of the conductance varying valves was varied so as to linearly decrease the exhaust resistance as illustrated in FIG. 7, whereas in the present example the aperture rate of the conductance varying valves was changed stepwise to decrease the exhaust resistance stepwise as illustrated in FIG. 8. Using the two reaction vessel sections 101 and 110, three lots of a-Si based photosensitive members, i.e., 36 members were made according to the aforementioned operation procedures.

Just as in Example 2, each of the a-Si based photosensitive members produced in the present example was also set in a copying machine (trade name: NP-6750; mfd. by CANON Inc.) modified for the tests and evaluated as to the three items of "optical memory," "characteristic variability," and "image defects" in accordance with the aforementioned evaluation methods.

Table 6 presents the evaluation results. Just as in Table 3, Table 6 also shows the results of relative evaluation in five levels on the basis of the results in the condition that the pressure in the reaction vessels 106 was $4 \times 10^3$ Pa, in Comparative Example 2.

"Optical memory" was evaluated by the classification of the following five levels:

◎ improvement of not less than 20%;

○ improvement of not less than 10% but less than 20%;

Δ improvement of not less than 5% but less than 10%;

▲ improvement of less than 5% or degradation of less than 5%;

× degradation of not less than 5%.

"Characteristic variability" were evaluated by the classification of the following five levels:

◎ improvement of not less than 40%;

○ improvement of not less than 20% but less than 40%;

Δ improvement of not less than 10% but less than 20%;

▲ improvement of less than 10% or degradation of less than 10%;

× degradation of not less than 10%.

"Image defects" were evaluated by the classification of the following five levels:

◎ improvement of not less than 80%;

○ improvement of not less than 40% but less than 80%;

Δ improvement of not less than 20% but less than 40%;

▲ improvement of less than 20% or degradation of less than 20%;

× degradation of not less than 20%.

The results of the present example shown in Table 5 were compared with the results of the samples made in such a manner that upon opening of the reaction-vessel-side vacuum seal valves 108 under the condition of $P1=1\times10^3$ Pa and $P2=1\times10^2$ Pa, the conductance varying valves were preliminarily fully opened (where the exhaust resistance was equivalent to the value indicated by 30 in FIG. 8) and thereafter the evacuation was continued at the constant exhaust resistance without change of the aperture rate, in Example 2. The both examples demonstrated prominent improvements in all the three items of "optical memory," "characteristic variability," and "image defects," and the present example exhibited the better result in "image defects." This better improvement in the "image defects" is comparable to that in aforementioned Example 4.

Accordingly, it was verified that the vacuum processing method of the present invention demonstrated the more prominent effects of the invention by employing such procedures that during the period of, after the connection between the reaction vessel sections 101 and 110 with the substrates therein, and the exhaust section 102, opening the reaction-vessel-side vacuum seal valves 108 to make the communication between the reaction vessel sections and the exhaust section, the exhaust resistance was first set large to limit the exhaust quantity of the exhaust section and thereafter the exhaust resistance was gradually decreased with progress of evacuation. It is also seen that the mode of decrease in exhaust resistance can be any mode of gradually decreasing the exhaust resistance according to the progress of evacuation, without any essential difference in the effect; e.g., not only the continuous change as in Example 4, but also the stepwise change as in the present embodiment.

The electrophotographic images formed using the electrophotographic, photosensitive members produced in Example 5 were extremely excellent without image smearing or the like.

TABLE 6

| Internal pressure P1 (Pa) | Example 5 | | |
|---|---|---|---|
| | Optical memory | Characteristic variability | Image defects |
| $1 \times 10^3$ | ◎ | ◎ | ◎ |

Example 6

Using a system having the structure similar to the system used in Example 2, deposited films were formed by the plasma CVD method, on cylindrical aluminum cylinders 605 having the diameter of 80 mm and the length of 358 mm. The high frequency power supplies 603 and 614 were set to the oscillation frequency of 100 MHz and the a-Si deposited films were formed under the deposition conditions presented in Table 2.

In the present example, during the connection between the movable reaction vessel sections and the exhaust section, the interior of the pipes 115 between the vacuum seal valves 108 and the vacuum seal valves 109 was evacuated by the auxiliary exhauster 113. The final pressure was 4.0 Pa in the pipes 115 evacuated by the auxiliary exhauster 113.

The procedures of formation of the a-Si deposited films in the present example will be described below.

First, the movable reaction vessel sections 101, 110 were connected through their connection flanges 104 to the substrate-loading exhauster (not shown), and the Ar supplying pipes (not shown), and the power supply lines to the reaction vessel sections 101, 110 were also connected. In this state, the cylindrical substrates 605 were loaded into the reaction vessels 601 (106). Then, the vacuum seal valves 108 were opened to evacuate the interior of the reaction vessels 601 through the exhaust ducts 611 by the substrate-loading exhauster. After confirming that the interior of the reaction vessels 601 (106) was evacuated to below $1\times10^{-3}$ Pa, Ar was supplied at the flow rate of 500 sccm through the source gas supply means 612 into the reaction vessels 601 (106). While the pressure in the reaction vessels was maintained at 70 Pa by the unrepresented pressure regulating valves, the cylindrical substrates 605 were heated and controlled to 250° C. by the heaters 607. The heating state of the substrates under this pressure-reduced Ar atmosphere was maintained for two hours. During this period the cylindrical substrates 605 were rotated at the speed of 10 rpm via the rotation shafts 608 and gears 610 by the motors 609. During the Ar supply start period the flow rate of Ar was linearly increased from 0 sccm to 500 sccm in 5 minutes.

Next, the vacuum seal valves 108 are closed, the supply of Ar was stopped, and the reaction vessels 601 (106) were hermetically sealed in the pressure-reduced state. On that occasion, the supply of Ar was first stopped and the vacuum seal valves 108 were closed at the internal pressure of $6\times10^1$ Pa in the reaction vessels 601 (106), and the heating of the substrates 605 by the heaters 607 was terminated. After that, the connection flanges 104 were disconnected from the substrate-loading exhauster and the Ar supplying pipes (not shown) connected to the source gas supply means 612, and the power supply lines to the reaction vessels 601 were also disconnected.

After the above operation, the movable reaction vessel sections 101 and 110 were moved to the installation site of the exhaust section 102 and the connection flanges 104 were connected through the Viton O-ring (vacuum seal) to the exhaust-side connection flanges 105. After that, the connection sections 103 were fixed by clamps. The source gas supply pipes (not shown) were connected to the source gas supply means 612 and the power supply lines and high frequency power supply cables were further connected to the reaction vessel sections 101 and 110.

After completion of these connections, the interior of the pipes 115 was first evacuated by the auxiliary exhauster 113. During the connection of the movable reaction vessel section 101, it was confirmed that the valve 111 was closed, and thereafter the valve 112 was opened to evacuate the interior of the pipes 115 by the auxiliary exhauster 113. When the pressure in the pipes 115 reached 4.5 Pa, the reaction-vessel-side vacuum seal valve 108 was opened to preliminarily evacuate the interior of the reaction vessel 106 by the auxiliary exhauster 113. When the pressure in the reaction vessel 601 (106) reached 4.2 Pa, the valve 112 was then closed and the exhaust-side vacuum seal valve 109 was opened. On this occasion, the pressure on the exhaust section side of the exhaust-side vacuum seal valve 109 was $1 \times 10^{-4}$ Pa. The conductance varying valve 114 was kept in the flow open state.

In the next place, while the cylindrical substrates 605 were rotated at the speed of 10 rpm via the rotation shafts 608 and gears 610 by the motors 609, Ar was supplied at the flow rate of 500 sccm from the source gas supply means 612 into the reaction vessel 601 and the pressure in the reaction vessel was adjusted to 70 Pa by the conductance varying valve 114. While reducing the internal pressure to 70 Pa, the cylindrical substrates 605 were again heated and controlled to 250° C. by the heaters 607 and that state was maintained for 20 minutes. During the Ar supply start period, the flow rate of Ar was linearly increased from 0 sccm to 500 sccm in 5 minutes.

After completion of the reheating of the substrates, the supply of Ar was stopped and the source gases under the conditions for the charge injection blocking layer presented in Table 2 were introduced through the source gas supply means 612. After the flow rates of the source gases reached the set flow rates, the conductance varying valve 114 was adjusted to set the pressure in the reaction vessel to the condition in Table 2. After confirming that the pressure in the reaction vessel 601 (106) became stable, the total output of the high frequency power supplies 603 and 614 was set to the power presented in Table 2 and the high frequency power was supplied through the matching boxes 604 and 613 to the cathode electrodes 602 and 606. The high frequency power radiated from the cathode electrodes 602 and 606 into the reaction vessel 601 (106) induced the plasma discharge to excite and dissociate the source gases, thereby starting formation of the charge injection blocking layers on the cylindrical substrates 605. After that, at the point of time when the charge injection blocking layers were formed in the thickness presented in Table 2, the supply of the high frequency power was stopped and then the supply of the source gases was also stopped, thereby terminating the formation of the charge injection blocking layers. After that, similar operation was repeated to form the photoconductive layer and surface layer sequentially, thereby obtaining the layered structures.

After completion of the formation of the a-Si based photosensitive members in this way, the source gas inside the reaction vessels 601 (106) and in the source gas supply pipes was fully purged and then the vacuum seal valves 108 and 109 were closed. Then, He was introduced into the reaction vessel 601 (106) thus hermetically closed, up to the internal pressure of 1000 Pa. After that, the connection section 103 was disconnected and the source gas supply pipes, power supply lines, and high frequency power supply cables were also disconnected, thus bringing the reaction vessel section 101 into the movable state.

Then, the reaction vessel section 101 was moved to the substrate unloading site and the substrates 605 were cooled to room temperature. Then, nitrogen was introduced through the unrepresented leak valve into the reaction vessel 601 (106) before the interior of the reaction vessel 601 (106) reached the atmospheric pressure. After the interior of the reaction vessel 601 (106) reached the atmospheric pressure, the substrates 605 with the deposited films thereon were taken out of the interior of the reaction vessel 601 (106).

After that, the reaction vessel 601 (106) after completion of the series of a-Si deposited film forming steps was restored by exchange of the internal components thereof whereby the reaction vessel 601 (106) was again brought into the deposition formable state.

On the other hand, subsequent to the deposited film forming step by use of the reaction vessel section 101, the reaction vessel section 110 was also moved to the exhaust section 102, connected to the exhaust section 102, and subjected to the deposited film forming steps according to similar procedures. After completion of the deposited film forming steps and completion of the substrate unloading, the reaction vessel section 110 was also subjected to the exchange of internal components thereof according to similar procedures, whereby the reaction vessel section 110 was brought again into the deposition formable state and was again used in the steps of forming the photosensitive members for electrophotography.

As described above, the reaction vessel section 101 and the reaction vessel section 110 were sequentially connected to the exhaust section 102 in order, and three lots of photosensitive members for electrophotography, 36 members in total, were made by each of the reaction vessel sections.

Comparative Example 3

In this Comparative Example, the deposited films were formed on the cylindrical aluminum cylinders 605 having the diameter of 80 mm and the length of 358 mm by the plasma CVD method in much the same manner as in Example 6, except that, during the movement of the reaction vessel sections 101 and 110 to the exhaust section 102 after the loading of the substrates 605 into the reaction vessel sections 101 and 110, the pressure in the reaction vessels 601 (106) was set at $6 \times 10^{-1}$ Pa. Using the two reaction vessel sections 101 and 110, three lots of photosensitive members for electrophotography, totally 36 members, were made by each of them.

In this comparative example, therefore, the pipes 115 were also evacuated by the auxiliary exhauster 113 during the connection of the reaction vessel sections 101 and 110 to the exhaust section 102 and the reaction-vessel-side vacuum seal valve 108 was opened at the point when the internal pressure of the pipes 115 reached 4.5 Pa. Since during the movement the pressure in the reaction vessel 601 (106) was kept at $6 \times 10^{-1}$ Pa, the opening of the vacuum seal valve 108 caused the residual gas to flow backward from the pipes 115 to the interior of the reaction vessel 601 (106). Consequently, after increase of pressure in the reaction vessel 601 (106) due to the back flow, the operation was carried out according to procedures of first closing the valve 112, disconnecting the auxiliary exhauster 113, and opening the exhaust-side vacuum seal valve 109.

Just as in Example 2, the a-Si based photosensitive members produced in Example 6 and in Comparative Example 3 were also evaluated as to the three items of "optical memory," "characteristic variability," and "image defects," according to the evaluation methods described in Example 2.

Table 7 presents the evaluation results. Table 7 describes the results of relative evaluation in five levels on the basis of the results of Comparative Example 3.

"Optical memory" was evaluated by the classification of the following five levels:

⊚ improvement of not less than 20%;

○ improvement of not less than 10% but less than 20%;

Δ improvement of not less than 5% but less than 10%;

▲ improvement of less than 5% or degradation of less than 5%;

× degradation of not less than 5%.

"Characteristic variability" were evaluated by the classification of the following five levels:

⊚ improvement of not less than 40%;

○ improvement of not less than 20% but less than 40%;

Δ improvement of not less than 10% but less than 20%;

▲ improvement of less than 10% or degradation of less than 10%;

× degradation of not less than 10%.

"Image defects" were evaluated by the classification of the following five levels:

⊚ improvement of not less than 80%;

○ improvement of not less than 40% but less than 80%;

Δ improvement of not less than 20% but less than 40%;

▲ improvement of less than 20% or degradation of less than 20%;

× degradation of not less than 20%.

It is apparent from Table 7 that the photosensitive members for electrophotography produced in Example 6 were clearly superior in all the three items of "optical memory," "characteristic variability," and "image defects," to those produced in Comparative Example 3. It was also verified from this comparison that the effects of the present invention were attained by such setting that on the occasion of linkage between the movable reaction vessel sections and the exhaust section, the first openable/closable opening provided in the movable reaction vessel section, i.e., the reaction-vessel-side vacuum seal valve 108 in this example was opened under the condition that the internal pressure of the reaction vessel was set higher than the pressure of the exhaust duct 115 communicating therewith. Namely, it was ensured that when the internal pressure of the reaction vessel was set higher than the pressure of the exhaust duct 115 communicating therewith, the by-products and the like accumulated in the exhaust duct 115 during the vacuum processing heretofore were effectively prevented from entering the interior of the reaction vessel.

The electrophotographic images formed using the electrophotographic, photosensitive members produced in Example 6 were extremely excellent without image smearing or the like.

TABLE 6

Example 6

| Optical memory | Characteristic variability | Image defects |
| --- | --- | --- |
| ⊚ | ⊚ | ⊚ |

As described above, according to the vacuum processing method of the present invention, it is possible to carry out a stable vacuum processing and a vacuum processing such as formation of a deposited film and the like without variability in quality.

In addition, according to the present invention, it is feasible to prevent a dust from attaching onto an article in a step of moving a vacuum processing vessel with the article being placed therein and connecting the vacuum processing vessel to a pressure-reduced space different therefrom.

Further, according to the present invention, in a vacuum process in which a vacuum processing vessel is moved with an article being placed therein, the vacuum processing vessel is connected to a pressure-reduced space different therefrom, and thereafter at least one of vacuum processing steps is carried out; by keeping the vacuum processing vessel in a pressure-reduced state during the movement, and on the occasion thereafter of, after the connection to the different pressure-reduced space, opening an openable/closable opening provided in the vacuum processing vessel to establish communication between them, by setting the internal pressure of the vacuum processing vessel higher than the pressure of the different pressure-reduced space communicating therewith, it is possible to prevent a dust from attaching onto the article and achieve increase in non-defective percentage of articles to be subjected to the vacuum process.

In addition, the present invention also makes it feasible to achieve improvement in the vacuum processing characteristics and suppression of variability among lots. Particularly, since the present invention permits selection of operation conditions, it does not degrade the flexibility of production, ensures excellent vacuum processing characteristics of vacuum-processed articles, and also ensures the uniformity in each lot, of course, and high repeatability among lots.

Namely, the present invention provides a vacuum processing method of a step configuration that is free from the factors to cause variability in the vacuum processing characteristics among lots and is also excellent in the flexibility of production.

What is claimed is:

1. A vacuum processing method comprising placing an article in a vacuum processing vessel and subjecting the article to at least one vacuum processing step therein with the vacuum processing vessel communicating with a pressure-reduced space different therefrom under reduced pressure, wherein the vacuum processing vessel has at least a first openable/closable opening, wherein the pressure-reduced space different from the vacuum processing vessel has at least a second opening, wherein the communication between the vacuum processing vessel and the pressure-reduced space different therefrom is established when, after closely connecting the first opening and the second opening to each other, the first openable/closable opening is brought into an open state, wherein for the connection, the vacuum processing vessel having the article placed therein is moved to locate the first opening and the second opening at closely connectable positions, and the first and second openings are connected to each other, and during the movement and connection, the first opening is kept in a closed state and the interior of the vacuum processing vessel is kept in a pressure-reduced state, wherein, for carrying out the at least one vacuum processing step, the communication between the different pressure-reduced space and the vacuum processing vessel with their respective openings being connected to each other is established by opening the first opening kept in the closed state during the connection, in a state in which the interior of the different pressure-reduced space is also kept in a pressure-reduced state, and wherein the internal pressure of the vacuum processing vessel kept in the pressure-reduced state during the movement and connection is set higher than the internal pressure of the different pressure-reduced space kept in the pressure-reduced state, when opening the first opening to establish the communication.

2. The vacuum processing method according to claim 1, wherein the internal pressure of the vacuum processing vessel kept in the pressure-reduced state during the movement and connection is not more than $1 \times 10^3$ Pa.

3. The vacuum processing method according to claim 1, wherein the internal pressure of the vacuum processing vessel kept in the pressure-reduced state during the movement and connection is not more than $1 \times 10^2$ Pa.

4. The vacuum processing method according to claim 1, wherein when P1 (Pa) represents the internal pressure of the vacuum processing vessel in the pressure-reduced state and P2 (Pa) represents the internal pressure of the different pressure-reduced space kept in the pressure-reduced state, which are brought into communication with each other by opening the first opening after the connection, the difference between P2 and P1 upon the communication satisfies the following relation:

$P1-P2 \geq 0.1$ Pa.

5. The vacuum processing method according to claim 4, wherein the difference between P2 and P1 satisfies the following relation:

$P1-P2 \geq 1$ Pa.

6. The vacuum processing method according to claim 1, comprising varying an exhaust resistance between the different pressure-reduced space and the vacuum processing vessel to be brought into communication with each other, after opening the first opening to establish the communication.

7. The vacuum processing method according to claim 6, comprising continuously or stepwise decreasing the exhaust resistance between the different pressure-reduced space and the vacuum processing vessel to be brought into communication with each other, after opening the first opening to establish the communication.

8. The vacuum processing method according to claim 1, wherein the at least one vacuum processing step, to which the article is subjected in the mutually communicating state of the different pressure-reduced space and the vacuum processing vessel, comprises a deposited film forming step.

9. The vacuum processing method according to claim 8, wherein the deposited film forming step as the at least one vacuum processing step comprises the step of forming a deposited film having a plurality of regions which are different at least in composition from each other.

10. The vacuum processing method according to claim 8, wherein the deposited film forming step is at least one step of formation of a deposited film for producing an electrophotographic photosensitive member.

11. A vacuum processing method comprising the steps of effecting interconnection and disconnection between the interior of a pressure-reduced vacuum processing vessel and a pressure-reduced space, and subjecting an article housed in the vacuum processing vessel to a vacuum processing, wherein the interconnection is effected in a state such that at least the pressure inside the vacuum processing vessel is higher than the pressure of the pressure-reduced space.

12. The vacuum processing method according to claim 11, wherein before the interconnection or after the disconnection the pressure inside the vacuum processing vessel is set to not more than $1 \times 10^3$ Pa.

13. The vacuum processing method according to claim 11, wherein before the interconnection or after the disconnection the pressure inside the vacuum processing vessel is set to not more than $1 \times 10^2$ Pa.

14. The vacuum processing method according to claim 11, wherein when P1 (Pa) represents the pressure inside the vacuum processing vessel in the pressure-reduced state before the interconnection and P2 (Pa) represents the pressure of the pressure-reduced space, the pressure difference between the pressures P1 and P2 satisfies the following relation:

$P1-P2 \geq 0.1$ Pa.

15. The vacuum processing method according to claim 14, wherein the difference between P2 and P1 satisfies the following relation:

$P1-P2 \geq 1$ Pa.

16. The vacuum processing method according to claim 11, wherein the pressure-reduced space is an exhaust path and the exhaust resistance of the exhaust path is varied after the interconnection.

17. The vacuum processing method according to claim 16, wherein the exhaust resistance of the exhaust path is decreased continuously or stepwise after establishing communication between the interior of the vacuum processing vessel and the exhaust path.

18. The vacuum processing method according to claim 11, comprising forming a deposited film in the vacuum processing vessel which Is in interconnection with the pressure-reduced space.

19. The vacuum processing method according to claim 11, wherein the pressure-reduced space comprises an exhaust path.

20. The vacuum processing method according to claim 18, wherein the deposited film comprises a semiconductor film.

* * * * *